United States Patent [19]

Batson

[11] Patent Number: 4,809,189

[45] Date of Patent: Feb. 28, 1989

[54] EQUIVALENT TIME WAVEFORM DATA DISPLAY

[75] Inventor: Brian E. Batson, Lake Oswego, Oreg.

[73] Assignee: Tektronix, Inc., Beaverton, Oreg.

[21] Appl. No.: 917,629

[22] Filed: Oct. 9, 1986

[51] Int. Cl.$^4$ .......................... G01R 13/22; G06F 7/00
[52] U.S. Cl. ....................................... 364/487; 364/521;
324/121 R; 340/744
[58] Field of Search ............... 364/481, 487, 521, 742;
324/121 R; 340/722, 347 SH, 744

[56] References Cited

U.S. PATENT DOCUMENTS

| | | | |
|---|---|---|---|
| 4,041,468 | 8/1977 | Perry et al. | 364/900 |
| 4,225,940 | 9/1980 | Moriyasu et al. | 324/121 R |
| 4,283,713 | 8/1981 | Philipp | 324/121 R |
| 4,495,586 | 1/1985 | Andrews | 364/487 |
| 4,507,740 | 3/1985 | Star et al. | 364/487 |
| 4,510,571 | 4/1985 | Dagostino et al. | 364/487 |
| 4,540,938 | 9/1985 | Bruce | 324/121 R |
| 4,559,920 | 12/1985 | Blair | 364/900 |
| 4,578,667 | 3/1986 | Hollister | 340/347 SH |
| 4,654,584 | 3/1987 | Gyles | 324/76 R |
| 4,678,345 | 7/1987 | Agoston | 324/77 R |
| 4,694,244 | 9/1987 | Whiteside et al. | 324/121 R |
| 4,701,863 | 10/1987 | Bruce | 364/521 |
| 4,719,416 | 1/1988 | Desautels | 324/121 R |

*Primary Examiner*—Parshotam S. Lall
*Assistant Examiner*—S. A. Melnick
*Attorney, Agent, or Firm*—Daniel J. Bedell

[57] ABSTRACT

A digital oscilloscope processes digitized input waveform data sequences according to a user defined mathematical expression to compute a processed waveform data sequence controlling a periodically updated waveform display on a screen. The waveform data is computed during equivalent time computation passes during each of which pass every Nth data of the waveform data sequence is computed. The first waveform data computed during each pass is selected in a pseudorandom fashion such that each data of the waveform data sequence is computed once every N computation passes. The value of N is suitably chosen so that the duration of each pass is substantially equal to the period between waveform display updates.

14 Claims, 15 Drawing Sheets

EQUIVALENT TIME WAVEFORM DATA DISPLAY

CROSS-REFERENCE TO RELATED APPLICATION

Cross-reference is made to co-pending U.S. patent application Ser. No. 06/912,024, entitled "Even/Odd Waveform and Message Controller", filed Sept. 25, 1986, setting forth related subject matter.

BACKGROUND OF THE INVENTION

The present invention relates in general to oscilloscopes of the type which digitize input waveforms to produce sequences of data, and in particular to an oscilloscope which processes such input waveform data sequences according to user defined mathematical expressions and displays the results as waveforms.

Digital oscilloscopes produce waveform displays by digitizing input waveforms to produce representative data sequences and by using the stored data sequences to control waveform displays on a screen. The advent of high speed microprocessors has made it possible for digital oscilloscopes to do more than just display the digitized waveform data. For example, a microprocessor in a multiple channel digital oscilloscope may add two digitized input waveform data sequences to produce a third data sequence displayed as a third waveform representing the sum of the two input waveforms. This is helpful, for instance, in checking the response of a modulating circuit summing two input waveforms. Such an oscilloscope can digitize the modulating circuit input and output waveforms, sum the two input waveforms, and then display the result as an "expected" modulating circuit output waveform. When the actual modulating circuit output waveform is also displayed, the difference between the expected and actual modulating circuit output waveforms can be easily observed. Since any electronic circuit can be modeled by transfer functions relating its outputs to its inputs, and since a microprocessor can be programmed to combine sequences of stored waveform data according to any arbitrary function, a suitably programmed microprocessor-based digital oscilloscope could produce and display corresponding "expected" and "actual" output waveforms for a wide variety of electronic circuits.

However a microprocessor requires a certain amount of time to recalculate waveform data after an input change. This recalculation time can be relatively long compared to the time between screen updates and therefore an oscilloscope can require a noticeably long time to update the display of a calculated waveform in response to a change in input data. During the time required to completely recalculate a waveform data sequence, the oscilloscope screen may be updated several times and the displayed waveform after each screen update is based partly on data calculated before an input change and partly on data calculated after the input change. When a waveform data sequence is recalculated in sequential order, the change to the displayed waveform appears to "snake" across the screen as successive sections of the waveform are recomputed between each screen update. The slow waveform recalculation and display update and the snaking of the display update can be confusing and distracting to an operator monitoring a calculated waveform. This slow, confusing and distracting visual feedback provided by the oscilloscope can be particularly annoying when an operator attempts to adjust an input waveform or other parameter affecting the calculated waveform so as to produce a desired change in the calculated waveform.

What is needed and would be useful is a method and apparatus for recomputing and displaying the waveform data so that a change to the calculated waveform resulting from a change to the input data is quickly reflected in the display of the calculated waveform and so that distracting patterns in the waveform display update are eliminated.

SUMMARY OF THE INVENTION

In accordance with one aspect of the invention, a microprocessor-based digital oscilloscope processes input data according to a user defined mathematical expression to compute a waveform data sequence to be displayed as a "processed" waveform on a screen, the display being updated periodically to reflect changes in the waveform data sequence due to changes in input data. The processed waveform data sequence is computed during successive "equivalent time" computation passes wherein every Nth data of the waveform data sequence is computed. The first waveform data computed during each computation pass is selected such that each data in the waveform data sequence is computed once every N computation passes so that when the input data changes, the processed waveform display is completely updated after N calculation passes. An outline of the entire computed waveform is displayed following the first computation pass since every Nth data of the waveform data sequence is recomputed during the first computation pass. This "first pass" waveform outline provides a substantially immediate indication of the eventual shape of the entire calculated waveform following the input data change.

In accordance with another aspect of the invention, the value of N is chosen such that the duration of each computation pass is substantially equal to the period between display updates. Thus an outline of the recomputed waveform based on the every Nth waveform data computed during the first computation pass is displayed within one or two screen updates following a change in the input data, thereby providing apparent real time display response to a change in input data. The outline of the recomputed waveform is progressively filled in with each successive display update to reflect the results of successive computation passes. When the value of N is chosen such that the duration of each computation pass is substantially equal to the period between screen updates, the outline of the recomputed waveform displayed after the first update following an input data change extends over the entire length of the waveform display and includes a maximum number of recomputed waveform data points.

In accordance with a further aspect of the invention, the first data of the waveform recomputed during each successive computation pass is selected in a pseudorandom fashion so that an observer will not be distracted by any recognizable pattern in the way the waveform outline is filled in during successive computation passes following a change in input data. The use of "equivalent time" computation passes between each screen update eliminates "snaking" of the waveform update across the screen and the pseudorandom selection of first data for each computation pass eliminates the appearance of distracting snaking or other patterns in the filling in o successive sections of the displayed waveform.

In accordance with yet another aspect of the invention, the processed waveform display is blanked following a change to the input data and the waveform is subsequently redisplayed only as the waveform data points are recomputed. Thus when the input data changes, the outdated waveform display immediately disappears, the recomputed first computation pass outline of the waveform reappears on the screen shortly thereafter, and the recomputed waveform outline gradually fills following subsequent computation passes. The blanking of the outdated waveform makes it easier for an operator to see the outline of the recomputed waveform when it appears.

It is accordingly an object of the invention to provide a new and improved method and apparatus for computing a waveform data sequence controlling the display of a processed waveform on a screen.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
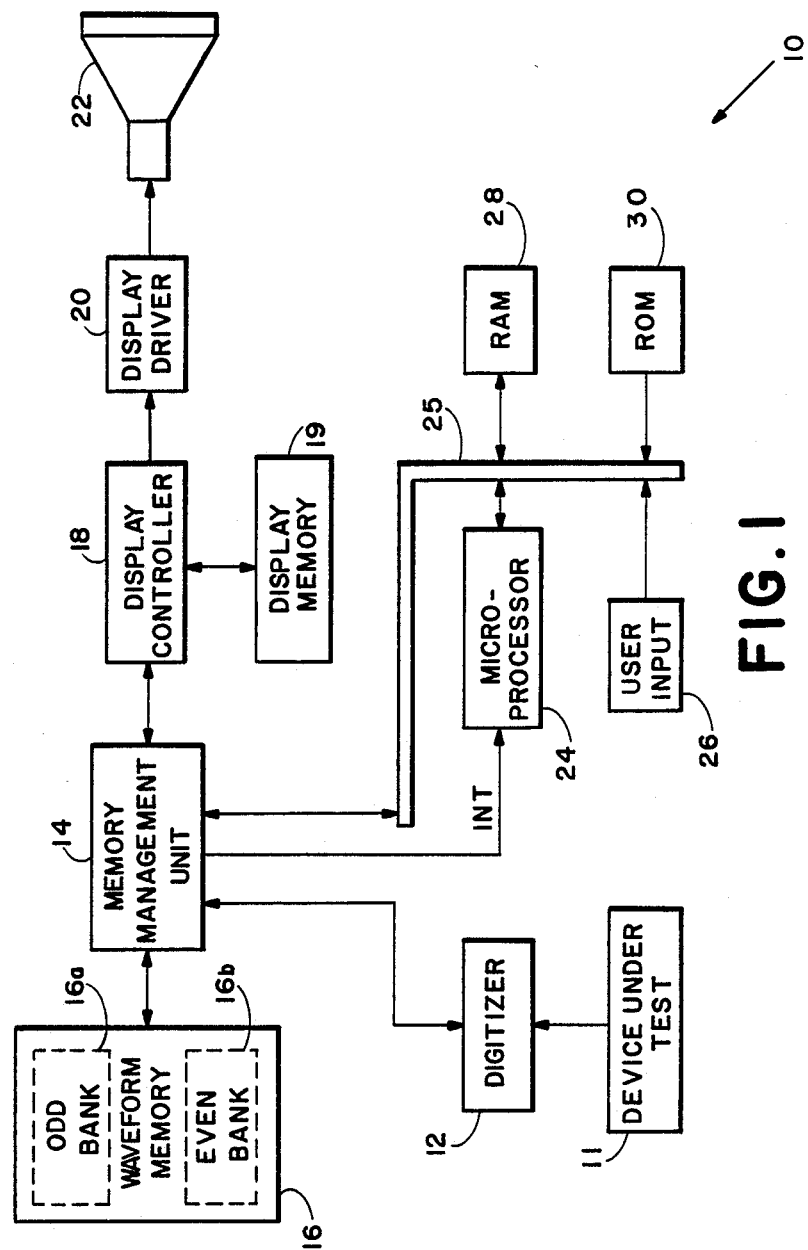
FIG. 1 is a block diagram of a microcomputer-based digital oscilloscope implementing the present invention.

Referring to FIG. 1, a computer-based digital oscilloscope 10 shown in block diagram form includes a digitizer 12 which samples and digitizes analog waveforms from a device under test 11 and transmits digitized data sequences representing the analog waveforms to a memory management unit (MMU) 14. The MMU 14 stores the waveform data sequences in a random access waveform memory 16 and subsequently transmits waveform data stored in waveform memory 16 to a display controller 18. The display controller 18 converts the incoming waveform data into display control data, stores the display control data in a display memory 19, and periodically transmits the stored display control data to a display driver 20 which controls the display of the data as waveforms on a cathode ray tube 22.

A microprocessor 24 communicates with digitizer 12, MMU 14 and display controller 18 based on commands from a user via user input devices 26 such as a keyboard, control knobs and the like, connected to the microprocessor 24 through a computer bus 25. A random access memory (RAM) 28, and a read only memory (ROM) 30 are also connected to bus 25. The ROM 30 contains program instructions for controlling the operation of microprocessor 24 which utilizes RAM 28 for temporary data storage.

The digitizer 12 simultaneously samples up to 14 different waveforms produced by the device under test 11 and transmits sample data sequences to MMU 14 which stores the data sequences at separate sets of contiguous addresses in waveform memory 16. Waveform memory 16 is large enough (for example one half megabyte) to store waveform sample data representing several hundred previously digitized waveforms. The oscilloscope 10 simultaneously displays up to eight different waveforms based on selected waveform data stored in the waveform memory 16.

Microprocessor 24 transmits control data to MMU 14 indicating where in the waveform memory 16 the incoming waveform data sequences from the digitizer 12 are to be stored, what waveform data sequences in waveform memory 16 are to be transmitted to display controller 18, and when waveform data is to be transmitted to the display controller to update the waveform display on screen 22. The microprocessor 24 also provides graphical and text display information to display controller 18 via MMU 14 causing the display controller 18 to display graphics and text information on CRT 22 in conjunction with the waveform displays. The microprocessor 24 communicates with digitizer 12 via memory management unit 14 in order to adjust operating parameters of the digitizer and to tell the digitizer what waveform memory 16 addresses are to receive the waveform data sequences produced by the digitizer.

According to the present invention, the microprocessor 24 generates "processed" waveform data sequences representing simulated waveforms in the same way that sequences of data from digitizer 12 represent real waveform inputs to digitizer 12. The microprocessor 24 computes the value of each data in a processed waveform data sequence according to a mathematical expression specified by a user through user input devices 26. The mathematical expression may utilize the values of selected digitized or processed waveform data stored in waveform memory 16 as independent variables, may utilize integer and floating point constants having values set by control knobs or other input devices 26, and may make use of a function library stored in ROM 30, the library including such mathematical functions as addition, subtraction, multiplication, division, roots and powers, trignometric functions, and the like. Microprocessor 24 may simultaneously produce data sequences for up to eight processed waveforms, each computed according to a separate user defined mathematical expression, the data sequences being transmitted to the MMU 14 in an interleaved fashion. MMU 14 stores the sequences in memory 16 for subsequent transmission to display controller 18 for display as waveforms on CRT 22.

As can be seen from the foregoing description of the digital oscilloscope system 10 of FIG. 1, the digitizer 12, the display controller 18 and the microprocessor 24 all have competing demands for access to the waveform memory 16. For example at the same time digitizer 12 wishes to transmit digitized waveform data for storage in the waveform memory 16, the microprocessor 24 may want to transmit processed waveform data for storage in the memory, and the display controller 18 may want to read data out of the memory. These competing demands for memory access can limit the real time performance of the oscilloscope in terms of its ability to rapidly generate, store and display waveform data. Memory management unit 14 is provided to arbitrate these competing demands for memory access from digitizer 12, display controller 18, and microprocessor 24. Moreover, memory 16 and MMU 14 are adapted to permit concurrent access to the waveform memory 16 by any two of these devices during a single memory access cycle, thereby improving the real time performance of the oscilloscope.

The waveform memory 16 is organized into an "odd" bank 16a for storing data at all of the "odd" memory addresses of the memory address space provided by the waveform memory and an "even" bank 16b for storing data in all of the "even" memory addresses of the memory address space. The state (logical 1 or 0) of the least significant bit of the memory address determines whether an address is "odd" or "even". Each bank is independently accessible in the sense that each communicates independently with the MMU 14 through separate data, address and control lines. When a data processing device (such as digitizer 12, display controller 18 or microprocessor 24) writes or reads a data word sequence to or from contiguous sequences of memory addresses, the banks 16a and 16b are accessed in an alternating fashion. For example when a first data word of a sequence is written to an odd address in the odd memory bank 16a, a second data word is written to the next higher (even) address in the even memory bank 16b, the third data word of the sequence is written to the next higher address in the odd bank 16a, and so on. When two data processing devices attempt to write data into the waveform memory 16 at the same time, the MMU 14 controls access to the even and odd banks such that during one memory access cycle, a first data processing device writes to the odd bank 16a, while a second data processing device writes to the even bank 16b and during a next memory access cycle, the first data processing device writes to the even bank while the second data processing device writes to the odd bank. In this arrangement each data processing device is able to write a data sequence into (or read a data sequence out of) memory 16 without substantially interfering with the rate at which the other device writes a data sequence into (or reads a data sequence out of) the memory.

Figure 2:
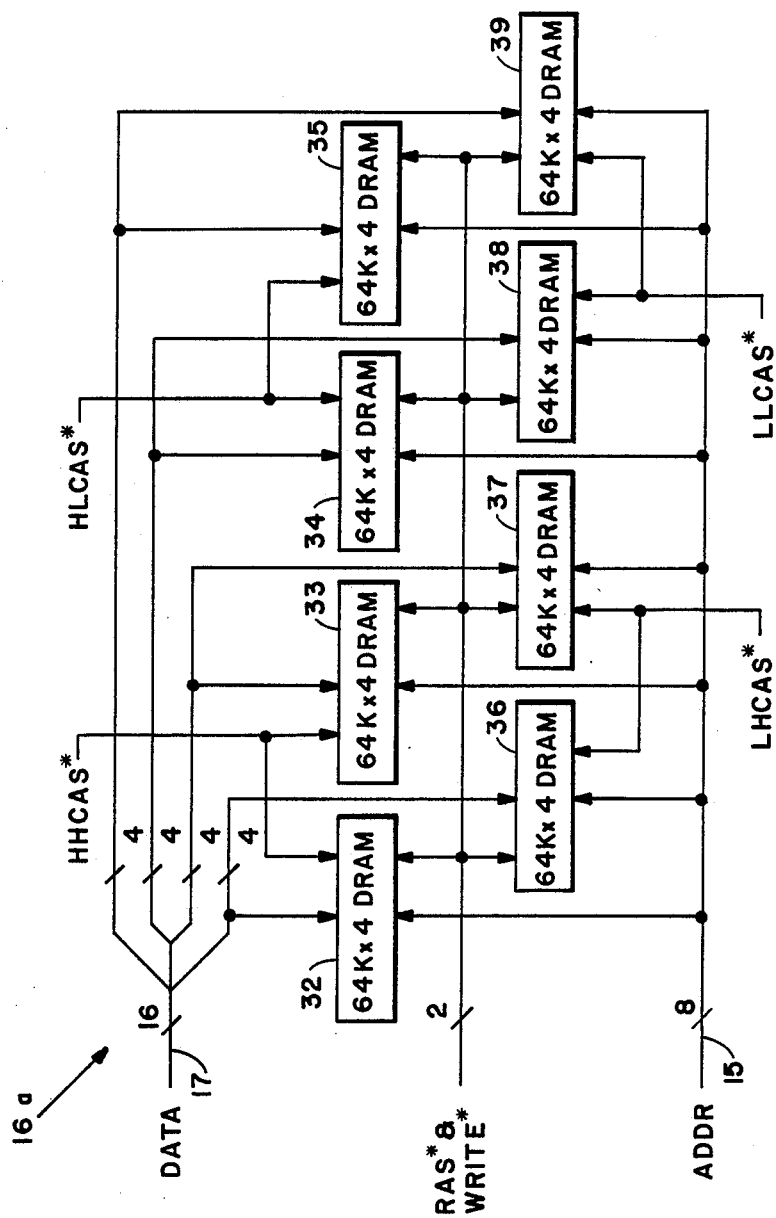
FIG. 2 is a block diagram of the odd bank of the waveform memory of FIG. 1.

Each bank 16a and 16b provides for storage of 256K sixteen bit words. Referring to FIG. 2, the odd bank 16a of the waveform memory 16 of FIG. 1 is depicted in more detailed block diagram. (The even bank 16b of the waveform memory has substantially identical topology to the odd bank and is not further detailed herein). The odd bank 16a includes a set of four pairs of 64K×4 bit dynamic random access memory chips (DRAM's) 32/33, 34/35, 36/37 and 38/39. An eight bit address bus 15 and eight bits of a sixteen bit data bus are applied to address and data terminals of each DRAM pair. An inverted row address strobe (RAS) signal RAS* (the * symbol indicates an active low signal) and an inverted write strobe signal WRITE* from the MMU 14 of FIG. 1 are applied to write control and RAS inputs of each DRAM. A column address strobe (CAS) signal HHCAS* controls CAS inputs of DRAM pair 32/33 while other inverted CAS signals HLCAS*, LHCAS*, and LLCAS* control the CAS inputs of DRAM pairs 34/35, 36/37, and 38/39 respectively.

An eight bit data word may be written into (or read from) a selected address in any DRAM pair in a single memory write (or read) operation by placing the 8 bit word on eight lines of the data bus 17 connected to the pair, setting the WRITE* signal for a read or write operation, placing the first eight bits of the address on the address bus 15, asserting the RAS* signal, placing the second eight bits of the selected address on the address bus, and then asserting the appropriate CAS signal. A sixteen bit data word may be written into (or read from) a selected address in two DRAM pairs following a similar procedure except that a sixteen bit data word rather than an eight bit data word is placed on the sixteen bit data bus 17 leading to the DRAM pairs and CAS signals controlling the two DRAM pairs are simultaneously asserted.

Referring again to FIG. 1, the microprocessor 24 may read or write either eight or sixteen bit data words in memory 16. In order for the microprocessor 24 to access a particular eight bit waveform memory 16 location it must provide the MMU 14 with at least 19 address bits. One address bit indicates whether the odd bank or the even bank is to be accessed, two bits indicate which pair of DRAMs are being accessed (i.e., which of four CAS signals is to be asserted), eight bits determine the row address of the selected DRAM storage location to be accessed and another eight bits determine the column address of the DRAM storage location. The digitizer 12 and the display controller 18 access the memory using 16 bit words and only 18 address bits are needed, since only a single bit is required to determine which pair of the two pairs of CAS lines (HHCAS* and HLCAS* or LHCAS* and LLCAS*) are to be strobed.

Figure 3:
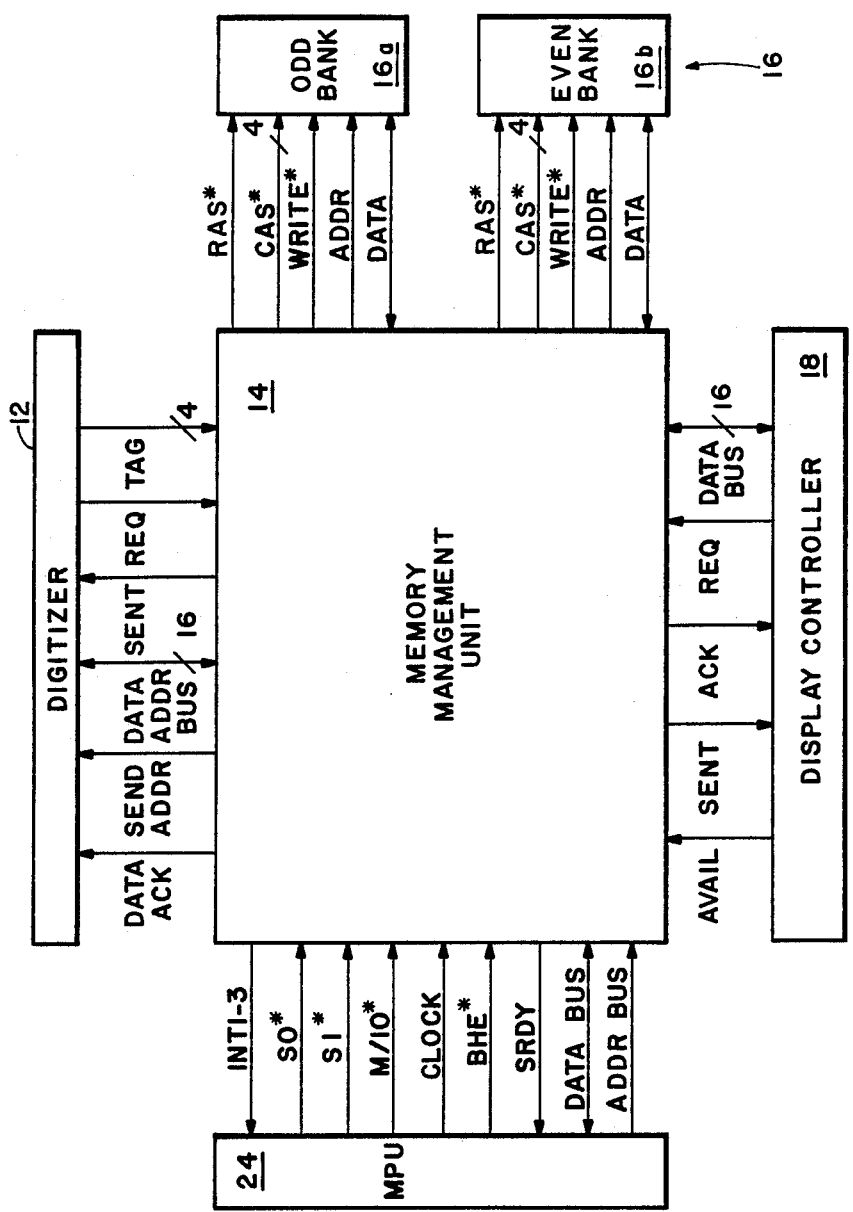
FIG. 3 is a block diagram showing interconnections between the memory management unit, and the waveform memory, the microprocessor, the display controller, and the digitizer of FIG. 1.

Referring to FIG. 3, the control, data and address lines interconnecting the MMU 14 to the odd bank 16a, the even bank 16b, the digitizer 12, the display controller 18 and the microprocessor 24 of FIG. 1 are shown in more detail. The digitizer 12 transmits data and addresses to the MMU 14 through a common sixteen bit data/address bus. When the digitizer 12 is ready to send a 16 bit data word to the MMU 14 for storage in one of the memory banks, it transmits a request signal (REQ) to the MMU 14. When the MMU 14 is ready to receive the address from the digitizer 12, it transmits a SEND ADDR signal to the digitizer causing the digitizer to place the address on the address/data bus. On the trailing edge of the SEND ADDR signal, the MMU 14 stores the address in an internal register and transmits an acknowledge signal (DATA ACK) to the digitizer 12. On receipt of the DATA ACK signal, the digitizer 12 places a sixteen bit data word on the bus. On the trailing edge of the DATA ACK signal the MMU 14 stores the data in another internal register. At this point the digitizer 12 may request another data transmission if it has another data word to transmit.

The digitizer 12 provides only a sixteen bit address with each data transmission to the MMU 14 but 18 address bits are required to indicate the location in memory 16 where the data is to be stored. The additional address bits are supplied by the MMU 14 prior to accessing the waveform memory. The digitizer may write data into any of 14 predetermined areas of the waveform memory 16 and the 16 address bits provided by the digitizer are utilized to determine the specific address within a particular predetermined memory area at which a data word is to be stored. The memory area to receive the data is indicated by four bit "TAG" data provided to the MMU 14 by the digitizer 12 with the 16 bit address. The particular areas in memory are predetermined by data provided to the MMU 14 by the microprocessor 24 in a manner described hereinbelow.

When the MMU 14 has control data to send to the digitizer 12, and the digitizer is not currently requesting to transmit data to the MMU, the MMU places the data on the data/address bus and asserts a SENT signal to the digitizer causing the digitizer 12 to read the data on the bus.

The display controller 18 acquires waveform and graphics data and messages stored in the waveform memory 16 via the memory management unit 14. In response to commands from the microprocessor 24, the display controller 18 may also write data into the waveform memory 16 via the MMU 14 for later access by the microprocessor. This feature is useful, for instance, in performing a "screen dump" wherein the microprocessor 24 requests the display controller to store the current contents of the display memory 19 of FIG. 1 in the waveform memory so that the microprocessor may later acquire the display data and cause a printer which may also be connected to bus 25 of FIG. 1 to print an image of the screen display.

The timing and flow of data between the waveform memory 16 and the display controller 18 of FIG. 3, and the production of the appropriate memory addresses for storage of the data are controlled by the MMU 14 according to information provided by the microprocessor 24. When the display controller 18 is free to receive waveform, graphics or message data stored in memory 16, it transmits an AVAIL signal to the MMU 14. Thereafter, when the MMU 14 is ready to transmit a 16 bit data word to the display controller 18, it places the data in memory on a data bus to the display controller and transmits a SENT signal to the display controller causing the display controller to read the data on the bus. When the display controller 18 wants to transmit data to the MMU 14 for storage in the waveform memory, it places the data on the data bus and sends a request (REQ) signal to the MMU. When the MMU 14 subsequently stores the data in memory 16 at a predetermined memory address, it asserts an acknowledge signal (ACK) to the display controller 18 to indicate receipt of the data.

Microprocessor 24 is suitably an Intel model 80826 which communicates with the MMU 14 via a 16 bit data bus, a 23 bit address bus and a number of control and interrupt lines. Communication between the microprocessor 24 and the MMU 14 is synchronized by a CLOCK signal provided by the microprocessor 24.

When the microprocessor 24 wishes to write data to the waveform memory 16, it places a memory address on its address bus and the data on its data bus to the MMU 14 and asserts an "S0*" control line to the MMU which causes the MMU 14 to read the address and data from the microprocessor 24 and to deassert an SRDY line to the microprocessor. When the MMU 14 subsequently stores the data in the waveform memory 16, it asserts the SRDY line to the microprocessor.

When the microprocessor 24 wants to read data out of the waveform memory 16, it places the address of the data on the address bus and asserts an S1* control line to the MMU 14. This causes the MMU to deassert the SRDY line, to acquire the addressed data from the waveform memory 16, to place the acquired data on the data bus to the microprocessor 24, and to reassert the SRDY line. When the SRDY line is reasserted, the microprocessor 24 reads the data on the data bus. During a memory read or write operation, the microprocessor 24 may access the waveform memory 16 utilizing either 8 or 16 bit data words. When it utilizes only 8 bit data words, the microprocessor asserts a byte high enable (BHE*) signal to the MMU 14.

The microprocessor 24 may also write data into various addressable registers within the MMU 14. As discussed in more detail hereinbelow, the data stored in these registers controls the generation of memory addresses when the digitizer 12 and the display controller 18 access the waveform memory 16 during transfer of waveform, graphics or display data between the waveform memory 16 and the display controller 18 and during transfer of instruction data from the waveform memory to the digitizer 16. The microprocessor 24 writes data into these registers by placing the data on the data bus and a register address on the address bus and then deasserting an M/IO* signal while asserting the S0* signal. Deassertion of the M/IO* signal indicates to the MMU 14 that the data on the data bus is to be written into a register rather than to the waveform memory 16 and that the address on the address bus indicates the register to receive the data. The MMU 14 also controls three interrupt inputs (INT1-3) to microprocessor 24. INT1 indicates to the microprocessor 24 that the digitizer 12 has a message to send to the microprocessor. Interrupt INT2 indicates that a data transmission sequence to or from the display controller 18 or to the digitizer 12 has been completed and interrupt INT3 indicates that the display controller has requested to transmit data. These interrupts are discussed in more detail hereinbelow.

Figure 4:
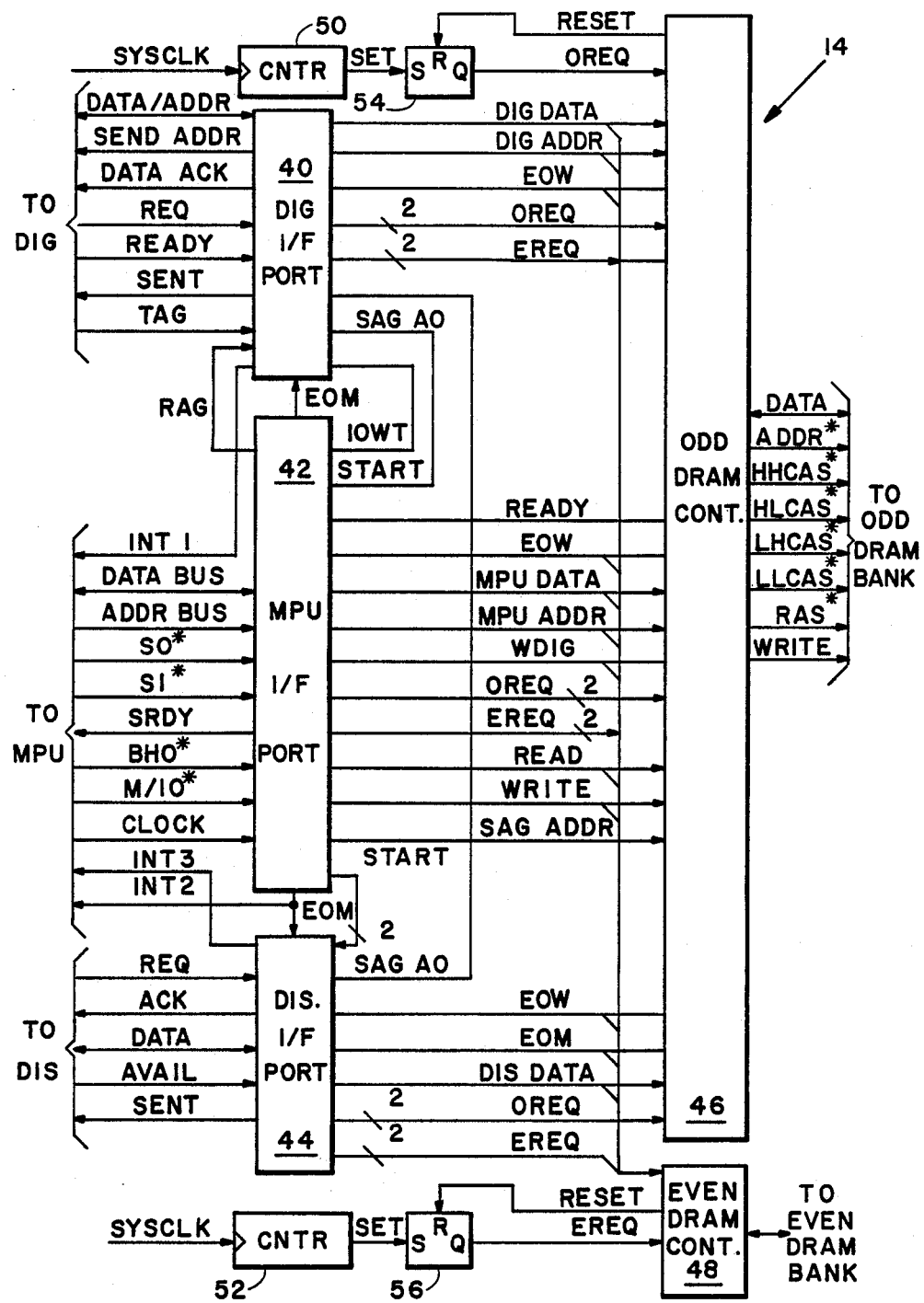
FIG. 4 is a more detailed block diagram of the memory management unit 14 of FIG. 3.

Referring to FIG. 4, the MMU 14 of FIGS. 1 and 3, shown in block diagram form, includes a set of three interface ports and a pair of DRAM controllers. A digitizer interface port 40 provides communication with the digitizer 12 of FIG. 1, a microprocessor (MPU) interface port 42 provides communication with the microprocessor 24 of FIG. 1, and a display interface port 44 provides communication with the display controller 18 of FIG. 1. An "odd" DRAM controller 46 controls access to the odd DRAM bank 16a of FIG. 1 while an "even" DRAM controller 48 controls access to the even DRAM bank 16b of FIG. 1.

When the digitizer transmits a request (REQ) to write a waveform data word to memory 16, the digitizer interface port 40 looks at the least significant bit of the memory address at which the data is to be stored to determine whether the data word is to be stored in the even DRAM bank or in the odd DRAM bank. The digitizer interface port 40 transmits a two bit "odd request" signal (OREQ) to the odd DRAM controller and a two bit "even request" signal (EREQ) to the even DRAM controller 48. The state of one of the two bits of the OREQ and EREQ signals indicates whether the digitizer is requesting a memory read access and the state of the other bit indicates whether the digitizer is indicating a memory write access.

When the microprocessor asserts the S0* signal to initiate a memory write operation, the microprocessor interface port 42 determines from the address provided by the microprocessor whether the data is to be stored in the even or in the odd bank and transmits appropriate single bit EREQ and OREQ signals to the even and odd DRAM controllers 46 and 48 indicating which memory bank is to receive the data. The microprocessor interface port 42 also includes a "sequential address generator" (SAG) adapted to generate a sequence of addresses starting and ending with addresses provided as data from the microprocessor and stored in registers in the microprocessor interface port 42. This address sequence is utilized to address the waveform memory when a stored data sequence is to be transmitted to the digitizer. Each time the SAG generates an address, the least significant bit (A0) of the SAG address is transmitted to the digitizer interface port 40 which determines from the A0 bit which DRAM bank is to be addressed and sets the bits of the EREQ and OREQ signals accordingly.

The SAG may also be utilized to address the waveform memory 16 when data is read out the waveform memory for transmission to the display controller 18 of FIG. 1 or when data from the display controller is written into the waveform memory. Accordingly, the least significant bit A0 of the SAG address is also provided to the display interface port 44 which determines from the A0 bit whether the even or odd bank is to be accessed and sets the bit states of two bit OREQ and EREQ signals transmitted to the odd and even DRAM controllers 46 and 48 to indicate which bank is being addressed and whether a read or a write operation is intended. To indicate when a memory access utilizing a SAG address is complete, the DRAM controller transmits an "end of word" (EOW) signal to each interface port.

The MMU 14 also includes a pair of counters 50 and 52 each of which counts cycles of a system clock (SYSCLK) and produces an output pulse after every N SYSCLK cycles. The output pulse of counter 50 sets a flip-flop 54 while the output pulse of counter 52 sets another flip-flop 56. The Q output of flip-flop 54 is applied as an OREQ input to the odd DRAM controller 46 and causes the odd DRAM controller to initiate a waveform memory refresh operation for the odd DRAM bank. Similarly the Q output of flip-flop 56 is applied as an EREQ input to even DRAM controller 48 and causes the even DRAM controller to initiate a memory refresh operation for the even DRAM bank. After a DRAM controller has initiated a refresh operation, it transmits a signal to reset the flip-flop which sent the refresh request.

The DRAM controllers 46 and 48 each contain arbitration circuits which monitor the OREQ and EREQ signals from flip-flops 54 and 56 and from interface ports 40, 42 and 44 and arbitrate read, write and refresh access to the associated DRAM bank when multiple requests for access are received. Whenever a memory bank access is completed, the DRAM controller for the bank checks the states of all the request signals and honors requests in order of priority. A memory refresh request is given highest priority, an access request for a message to the digitizer 12 of FIG. 1 is given next highest priority, and all other access requests share least highest priority in alternating fashion. When the digitizer and display interface ports each request access to the same memory bank, the DRAM controller for the bank alternately grants memory access to each interface port.

Each DRAM controller 46 and 48 includes a data multiplexing circuit which selectively connects a data bus from the digitizer interface port 40 (DIG DATA), from the microprocessor interface port 42 (MPU DATA) or from the display interface port 44 (DIS DATA) to the data lines of the associated DRAM bank. Each DRAM controller also includes an address multiplexing circuit which connects the eight address lines of the DRAM bank to eight lines of either a digitizer address bus (DIG ADDR) from the digitizer interface port 40, the microprocessor address bus (MPU ADDR) from the microprocessor interface port 42, or a SAG address bus (SAG ADDR) from the microprocessor interface port 42. When a DRAM controller grants an access request to an interface port, it connects the appropriate data and address lines from the requesting interface port to the DRAM bank, and transmits the appropriate RAS*, CAS* and WRITE* signals to accomplish the requested memory access.

Figure 5:
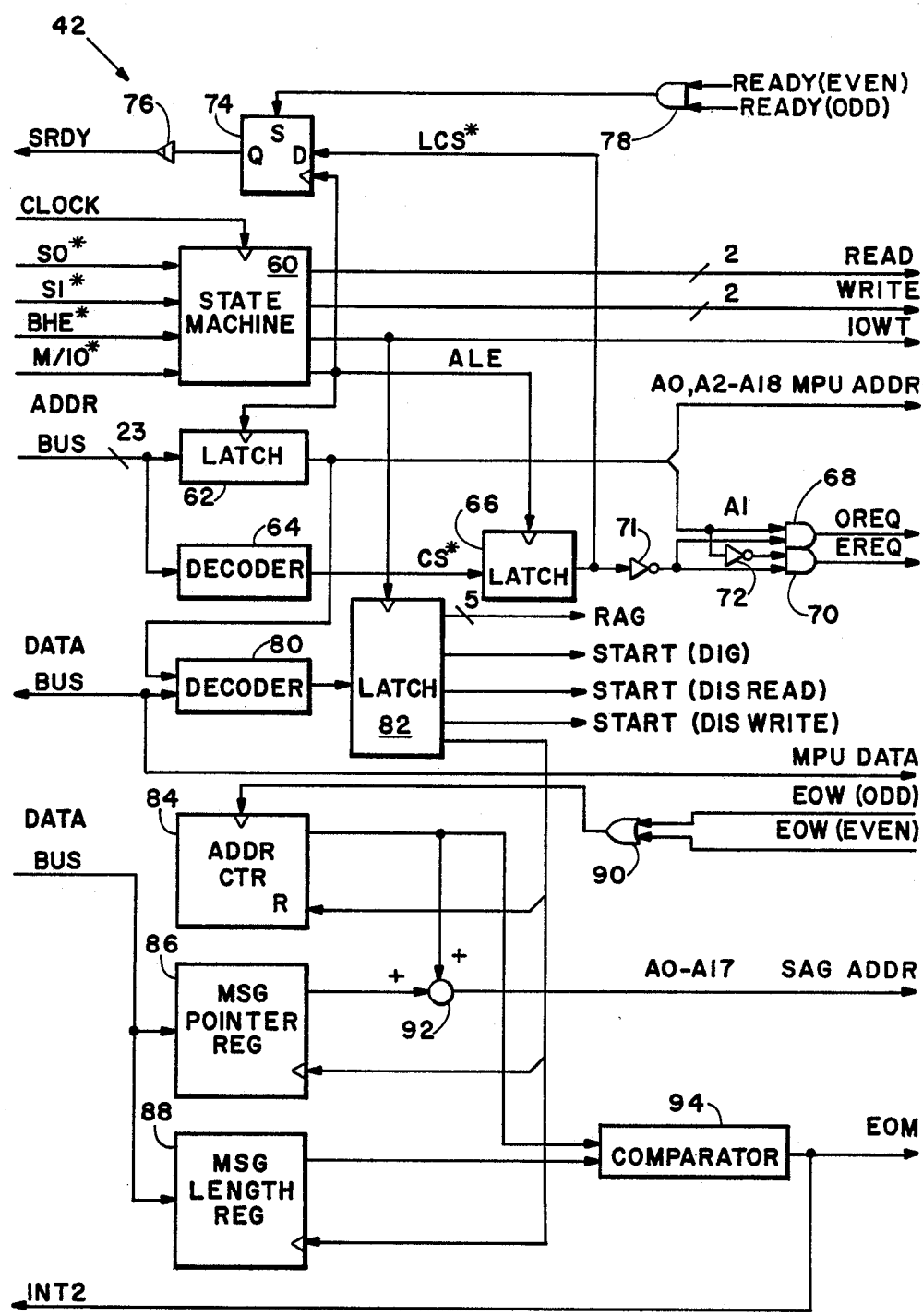
FIG. 5 is a more detailed block diagram of the microprocessor interface port of FIG. 4.

Referring to FIG. 5, the microprocessor interface port 42 of FIG. 4, depicted in more detailed block diagram form, includes a state machine 60 for receiving the S0*, S1*, BHE* and M/IO* control signals from the microprocessor 24, the state machine being clocked by the CLOCK signal from the microprocessor. When the state machine 60 determines from these control signal inputs that the microprocessor wants a memory read or write access, the state machine sets the state of a two bit READ signal and a two bit WRITE signal transmitted to each DRAM controller to indicate whether an eight bit or sixteen bit data word is to be read or written. At the same time, the state machine 60 generates an address latch enable signal (ALE) which causes a latch 62 to latch 19 bits of a 23 bit address on the address bus from the microprocessor onto the address lines (MPU ADDR) to both DRAM controllers. The 23 bit address on the address bus from the microprocessor is also applied to a decoder circuit 64 which produces an output bit CS* indicating whether the address on the address bus is within the address space provided by the waveform memory. The CS* bit is latched by another latch 66 also in response to the ALE signal from state machine 60.

Address bits A0 and A18 from the microprocessor indicate which of the four CAS* signals the DRAM controller is to generate, bits A2–A17 provide the sixteen bit DRAM address utilized to access memory locations in a DRAM bank, and bit A1 determines whether the even or odd DRAM bank is to be accessed. Bit A1 provides an input to an AND gate 68 and, through an inverter 72, to another AND gate 70. The content LCS* of latch 66, inverted by another inverter 71, provides another input to each AND gate 68 and 70. When A1 is high and the LCS* bit is low, the microprocessor is attempting to access an odd memory address within the waveform memory and the output of AND gate 68 is driven high to produce an OREQ signal transmitted to the odd DRAM controller 46 of FIG. 4. When the A1 and LCS* bits are low, the microprocessor is attempting to access an even memory address within the waveform memory and the output of AND gate 70 is driven high to produce an EREQ signal transmitted to the even DRAM controller. The LCS* signal inhibits the EREQ and OREQ signals when the microprocessor is attempting to access address space other than that provided by the waveform memory, such as provided by RAM 28 or ROM 30 of FIG. 1.

The LCS* signal is also applied to a D input of a type D flip-flop 74 which is clocked by the ALE signal from the state machine 60. The Q output of flip-flop 74 drives an open collector buffer 76 which produces the SRDY signal transmitted to the microprocessor. As previously discussed, the SRDY signal is deasserted when the MMU is in the process of carrying out a memory read or write request from the microprocessor. At all other times the SRDY signal is asserted. "READY" signals generated by the even and odd DRAM controllers when they are not currently performing a memory access for the microprocessor are combined by an AND gate 78 to provide a signal for setting flip-flop 74. When neither DRAM controller is currently performing a memory access for the microprocessor, the READY signals are both set high, driving the output of AND gate 78 high, thereby setting flip-flop 74 and asserting the SRDY signal to the microprocessor to indicate that the interface port 42 is available for transmitting or receiving more data to or from the microprocessor. Thereafter, when the microprocessor decides to access the waveform memory, it places a waveform memory address on the address bus and that address is decoded by decoder 64 to produce the CS* signal latched into latch 66. The LCS* output of latch 66 is driven low, which in turn drives the Q output of flip-flop 74 low to deassert the SRDY signal.

The microprocessor interface port 42 also includes a decoder 80 which decodes the incoming data on the data bus from the microprocessor and the incoming address latched by latch 62 to provide eleven output signals to a latch 82. When the state machine 60 determines from its M/IO* control signal input from the microprocessor that the microprocessor is attempting to access IO space rather than memory space, it transmits an IO write signal (IOWT) to latch 82 causing it to latch the eleven signal outputs of decoder 80. The function of each latched output signal of decoder 80 is described hereinbelow.

The sequential address generator (SAG) portion of microprocessor interface port 42 includes an address counter 84, a message pointer register 86 and a message length register 88. The data bus from the microprocessor provides data input to registers 86 and 88. Three of the output signals of decoder 80 are utilized to reset counter 84 and to control the loading of data into registers 86 and 88. When the microprocessor wishes to initiate a transfer of a data sequence from the waveform memory to the digitizer or to the display controller, or when the microprocessor wishes to initiate a data sequence transfer from the display controller to the waveform memory, it utilizes three IO write operations. In a first IO write operation it stores the waveform memory address for the first word of the data sequence in the message pointer register 86. In a second IO write operation it stores data indicating the number of words in the sequence in message length register 88, and in a third IO write operation it resets the count of address counter 84 to zero. Each time one of the DRAM controllers completes a memory access utilizing a SAG address, it transmits an "end of word" (EOW) signal to the microprocessor interface port 42. The EOW signals from the even and odd DRAM controllers are combined by an OR gate 90 and the output of the OR gate drives the count input of counter 84. Thus counter 84 maintains a count of the number of words of the data sequence which have been written into or read out of the waveform memory. The count maintained by the address counter 84 and the starting address stored in message pointer register 86 are summed by a summing circuit 92 to produce the 18 bit SAG address (A0-A17). A comparator 94 compares the message length data stored in register 88 to the count maintained by counter 84 and transmits an "end of message" (EOM) signal to the digitizer and display interface ports when the count reaches the message limit to tell these ports that the data transfer has ended. The EOM signal is also transmitted back to the microprocessor as interrupt INT2 signal to tell the microprocessor that the data sequence transfer is complete.

Figure 6:
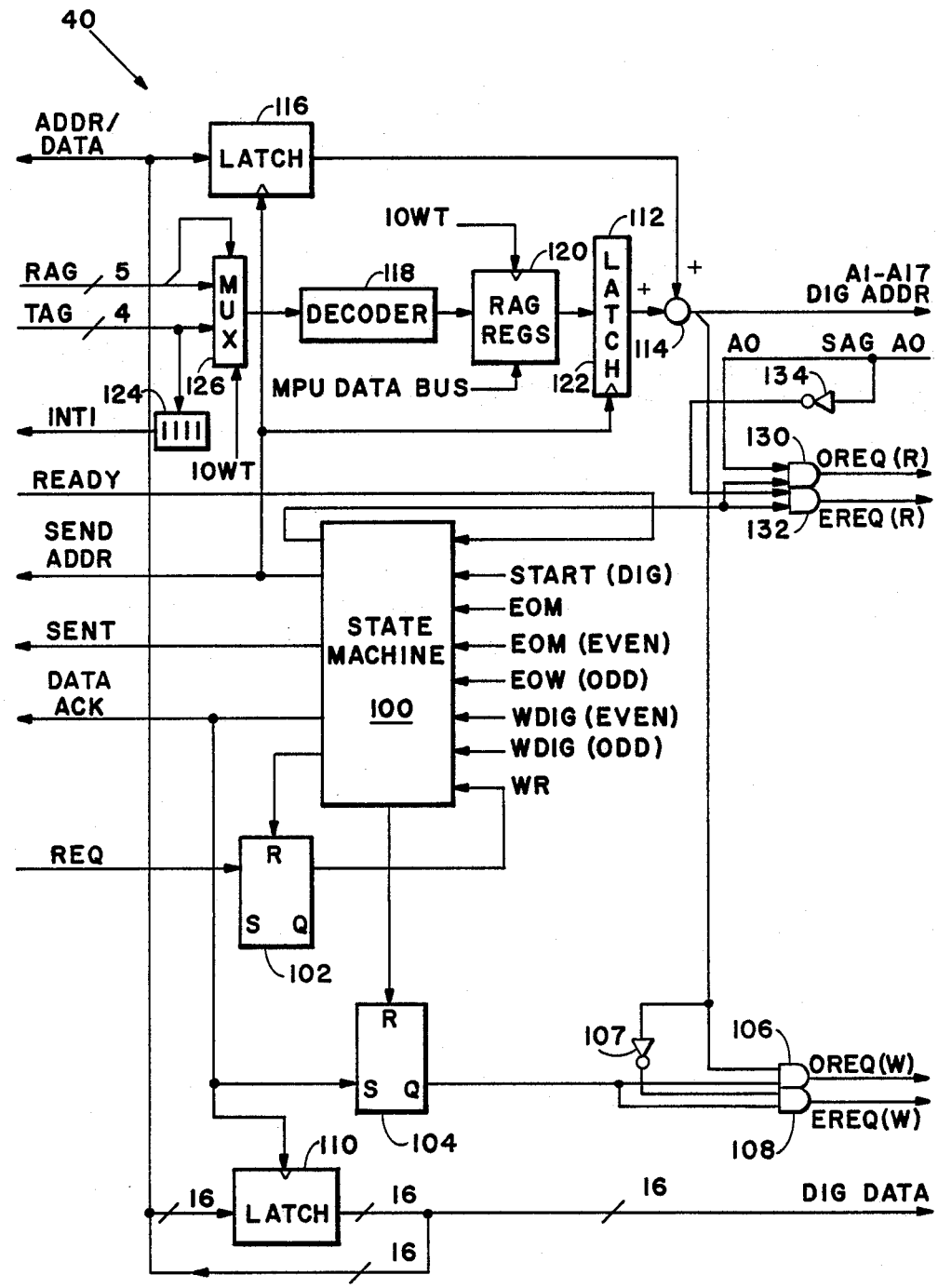
FIG. 6 is a more detailed block diagram of the digitizer interface port of FIG. 4.

Referring to FIG. 6, the digitizer interface port 40 of FIG. 4, depicted in more detailed block diagram form, includes a state machine 100 for arbitrating competing demands for use of the 16 bit data/address bus between the digitizer 12 and the MMU 14 of FIG. 3. The REQ signal sent by the digitizer to request a memory write operation sets a flip-flop 102 and the Q output of the flip-flop is provided as one input (WR) to state machine 100. "WDIG" signals generated by the even and odd DRAM controllers when they are currently performing a memory write access in response to a digitizer request are also provided as inputs to state machine 100 along with end of word signals (EOW) generated by the even and odd DRAM controllers upon completion of a memory access, a START signal generated by the microprocessor interface port 42 of FIG. 5 in order to initiate a data transfer from the waveform memory to the digitizer, and the end of message (EOM) signal generated by the microprocessor interface port at the end of a SAG sequence.

When the digitizer desires to write data to the waveform memory, it places a 16 bit address on the data/address bus and asserts the appropriate TAG lines. The TAG data on the TAG lines is transmitted through a multiplexer 126 to a decoder 118 which selects one of fourteen "random address generator" (RAG) registers 120, each of which stores the base address of a different waveform storage area in the waveform memory. Each RAG register is preloaded by data carried on the data bus from the microprocessor when addressed by four bits of a five bit RAG signal produced by the decoder 80 of the microprocessor interface port 42 of FIG. 5 when the RAG registers are write enabled by the IOWT signal generated by the microprocessor interface port during an IO write operation. The four register addressing bits of the five bit RAG signal are applied as separate inputs to multiplexer 126 and the switching state of multiplexer 126 is controlled by the fifth RAG signal bit.

When the digitizer wants to write data into memory it transmits the REQ signal to the digitizer interface port 40 and the Q output of flip-flop 102 sets to provide an indicating signal to the state machine 100. When the state machine determines that the MMU is ready to process the data write request, the state machine transmits the SEND ADDR signal to the digitizer, to a latch control input of a latch 116, and to the latch control input of latch 112. The SEND ADDR signal causes the digitizer to place the address on the data/address bus and the trailing edge of the SEND ADDR signal causes latch 116 to latch the 16 bit memory address on the data/address bus from the digitizer onto an input of a summing circuit 114 and causes latch 112 to latch a base address from a RAG register addressed by the TAG signal onto another input of the summing circuit 114. The summing circuit combines the base address and the 16 bit address from the digitizer to produce the 18 bit address needed to address the waveform memory.

Thereafter the state machine 100 transmits the DATA ACK signal to the digitizer causing the digitizer to place the data to be written into memory on the data/address bus. The DATA ACK signal is also transmitted to a control input of a latch 110 and on the trailing edge of the DATA ACK signal latch 110 latches the data on the data/address bus onto the DIG DATA lines to the DRAM controllers. At the same time, the state machine 100 resets flip-flop 102. The DATA ACK signal output of state machine 100 also sets another flip-flop 104, the Q output of which is connected to inputs of a pair of AND gates 106 and 108. The A0 bit of the memory address produced by summing circuit 114 is applied to another input of AND gate 106 and the A0 bit is inverted by an inverter 107 and applied to another input of AND gate 108. AND gate 106 produces one of the two OREQ signal bits transmitted by the digitizer interface port to the odd DRAM controller, this one indicating that the digitizer interface port is requesting a memory write access. Similarly, AND gate 108 produces one of the two EREQ signal bits transmitted to the even DRAM controller, also to indicate that the digitizer interface port is requesting a memory write access.

When either the even or the odd DRAM controller grants a memory write access to the digitizer interface port, the controller transmits a WDIG signal to state machine 100 indicating that the write operation is in progress. The state machine then resets flip-flop 104 to terminate EREQ or OREQ signal output of AND gate 108 or 106 to the DRAM controller. When the data in the DIG DATA bus is subsequently stored in memory, the DRAM controller transmits an EOW signal to state machine 100 to indicate completion of the memory write operation.

Data sequences may be read out of the waveform memory and transmitted to the digitizer utilizing the addresses provided by the SAG generator of the microprocessor interface port of FIG. 5. When the first address of a sequence is placed on the SAG address lines from the microprocessor interface port to the DRAM controllers, the A0 bit of the SAG address is transmitted to the digitizer interface port 40 of FIG. 6 and applied as an input to an AND gate 130 and through an inverter 134 to an input of another AND gate 132. AND gate 130 produces another bit of the two bit OREQ signal transmitted to the odd DRAM controller indicating that the digitizer interface port is requesting a memory read operation while AND gate 132 produces the second bit of the two bit EREQ signal transmitted to the even DRAM controller to fulfill a similar purpose. When the state machine 100 detects the START signal from the microprocessor interface port, it asserts an output signal applied to additional inputs of both AND gate 130 and AND gate 132, and the state of SAG address bit A0 determines which AND gate produces a read request signal output. The even or odd DRAM controller receiving the read request signal grants the request by placing a data word from the memory location indicated by the SAG address on the 16 DIG DATA lines carrying data from the DRAM controllers to the digitizer via the address/data bus. The DRAM controller then transmits an end of word (EOW) signal to the state machine 100. In response to the EOW signal, state machine 100 transmits a SENT signal to the digitizer, causing the digitizer to read the data on the address/data bus.

The state machine 100 continues to assert its output signal to AND gates 130 and 132 so that the EREQ and OREQ signals continue to be sent to the DRAM controllers in an alternating fashion as the SAG address A0 bit changes state after each data read operation. When the microprocessor interface port generates the last address of a SAG sequence, it transmits the end of message (EOM) signal to state machine 100. Upon receipt of the first EOW signal following the EOM signal, the state machine deasserts its output signal to the AND gates 130 and 132 to turn off the request signals to the DRAM controllers.

Figure 7:
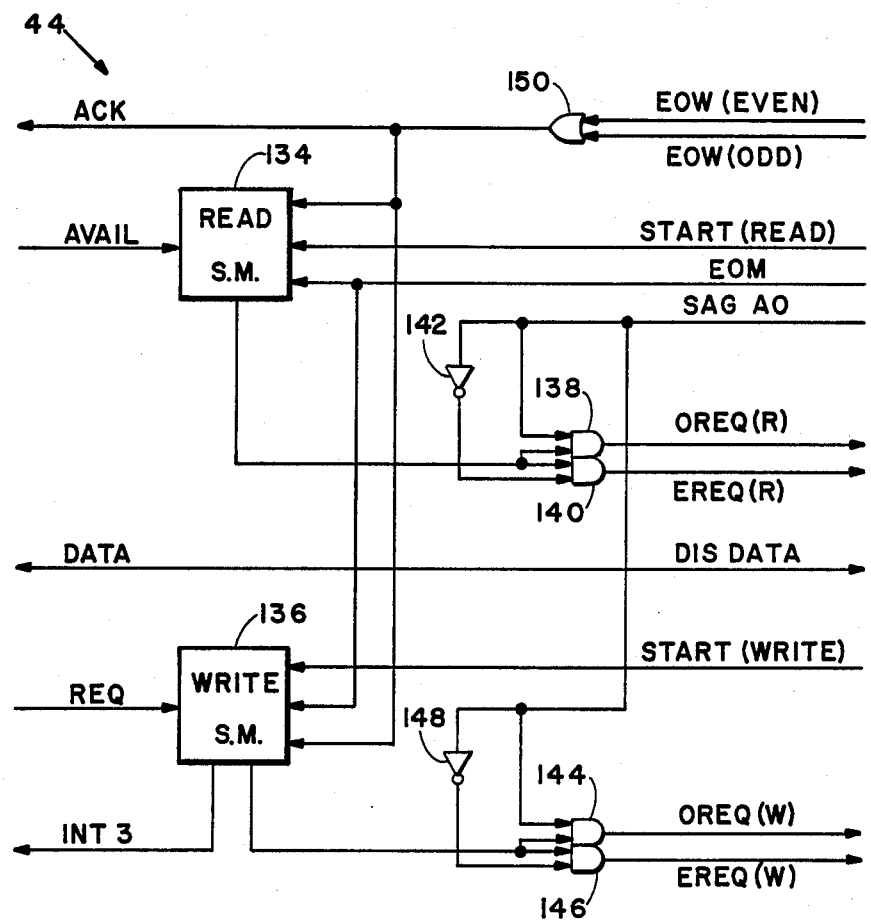
FIG. 7 is a more detailed block diagram of the display interface port of FIG. 4.

Referring to FIG. 7, depicting in block diagram form the display interface port 44 of FIG. 4, port 44 includes an asynchronous "read" state machine 134 for controlling data flow from the waveform memory 16 to the display controller 18 of FIG. 1 and an asynchronous "write" state machine 136 for controlling data flow from the display controller for writing to the waveform memory. The SAG addresses generated by the microprocessor interface port 42 of FIG. 5 are utilized to access the waveform memory for both read and write operations. The A0 bit of the SAG address, indicating whether the even or odd DRAM bank is to be accessed, is applied directly to inputs of AND gates 138 and 144 and indirectly, through inverters 142 and 148, to inputs of AND gates 140 and 146, respectively. The output of AND gate 138 is an OREQ signal to the odd DRAM controller indicating a memory read request while the output of AND gate 140 is an EREQ signal to the even DRAM controller also indicating a memory read request. The outputs of AND gates 144 and 146 are EREQ and OREQ signals, respectively, each conveying a memory write request to a DRAM controller.

When the display controller is free to receive data from memory, it asserts an AVAIL signal applied as input to state machine 134. Thereafter data transmission to the display controller may be initiated by a START signal from the microprocessor interface port also applied as an input to the state machine 134. On receipt of the START signal, the state machine 134 transmits a signal to inputs of AND gates 138 and 140 which signal causes one of the gates to initiate an OREQ or EREQ signal to a DRAM controller, depending on the state of the A0 SAG address bit generated by the microprocessor interface port. When the even or odd DRAM controller receiving the request grants the request (placing SAG addressed data on the data bus (DIS DATA) to the display controller), the DRAM controller generates an end of word (EOW) signal which is applied to an input of an OR gate 150. In response thereto, the OR gate 150 transmits the ACK signal to the display controller causing it to read the data on the bus. The ACK signal is also input to the read state machine 134 which deasserts the signal to the AND gates 138 and 140 to deassert the EREQ or OREQ signal and then monitors the AVAIL signal from the display controller. When the AVAIL signal is asserted, indicating that the display controller is ready to receive another data transmission, state machine 134 reasserts the signal to AND gates 138 and 140 to initiate another request. The process continues until the microprocessor interface port generates the last SAG address of the sequence, at which point the port transmits the end of message signal to the state machine 134. After detection of the next subsequent ACK signal output of OR gate 150, the state machine 134 stops initiating the OREQ and EREQ signals.

When the display controller wants to send data to the MMU for storage in the waveform memory, it places the data on its data bus to the MMU and asserts an REQ signal applied as input to write state machine 136. State machine 136 then transmits an interrupt signal (INT3) to the microprocessor telling the microprocessor to set up a SAG read operation. Thereafter, data transmission to the MMU is initiated by another START signal from the microprocessor interface port applied as input to the state machine 136. On receipt of the START signal, state machine 136 transmits a signal to inputs of AND gates 144 and 146 which causes one of these gates to initiate an OREQ or EREQ signal to an even or odd DRAM controller, depending on the state of the A0 SAG address bit. After the DRAM controller receiving the request grants the request by reading the data on the data bus from the display controller, the DRAM controller generates the end of word (EOW) signal applied to OR gate 150 and the OR gate transmits the ACK signal to the display controller causing it to place another data word on the data bus and to reassert the REQ signal. The ACK signal is also an input to state machine 136 and when the state machine detects the ACK signal it deasserts its output signal to the AND gates 144 and 146 to deassert the EREQ or OREQ signal and then monitors the REQ signal from the display controller. When the REQ signal is reasserted, indicating that the display controller is ready to send another data word, state machine 136 reasserts the signal to AND gates 144 and 146 to initiate another DRAM controller request. The process continues until the microprocessor interface port generates the last SAG address of the sequence, at which point it transmits the end of message (EOM) signal to the state machine 136. After detection of the next subsequent ACK signal, state machine 136 stops initiating the OREQ and EREQ signals.

Figure 8:
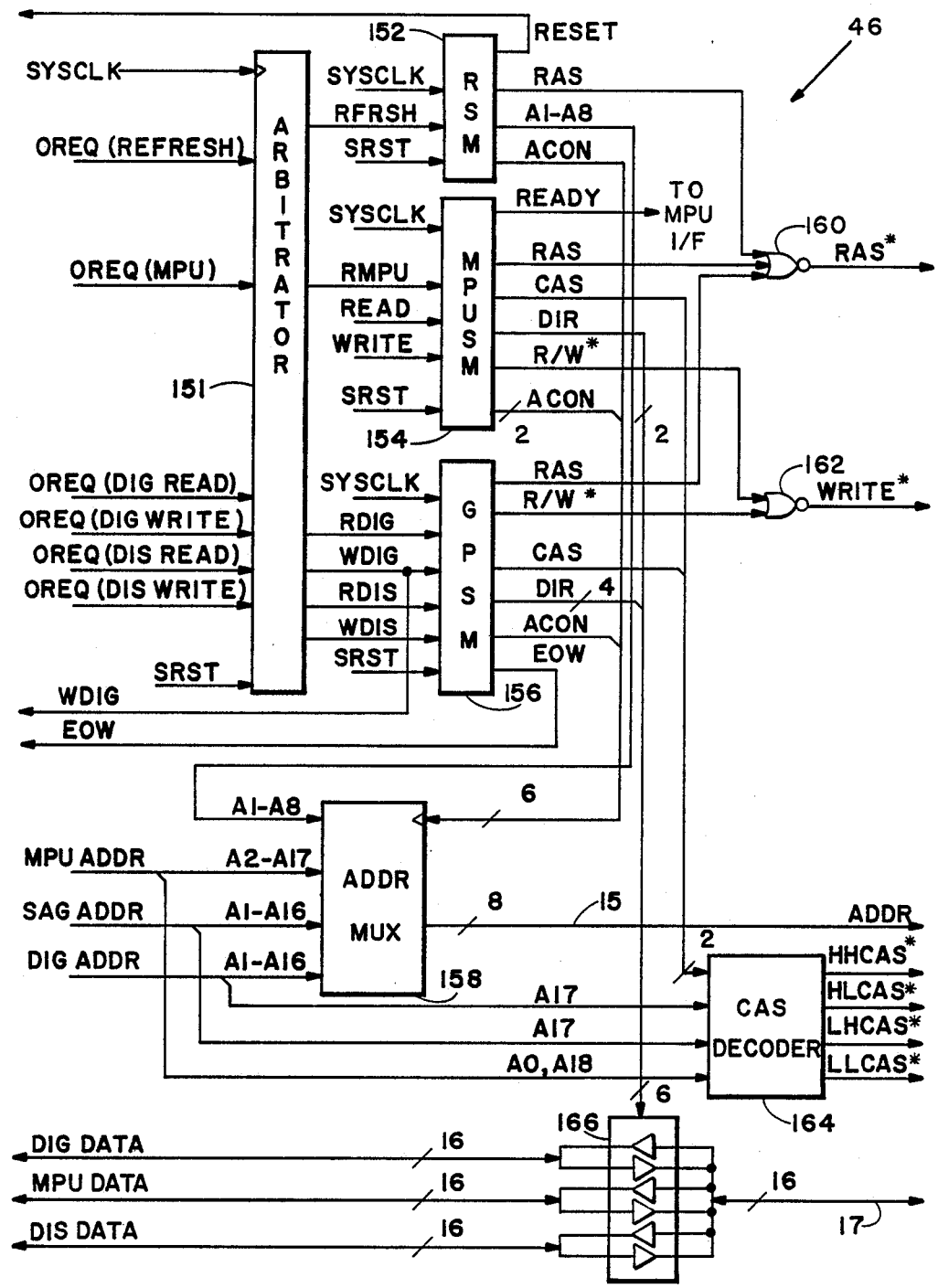
FIG. 8 is a more detailed block diagram of the odd DRAM controller of FIG. 4.

The odd and even DRAM controllers 46 and 48 of FIG. 4 are similar and only the odd DRAM controller 46 is discussed in detail herein. Referring to FIG. 8, depicting the odd DRAM controller 46 of FIG. 4 in block diagram form, the odd DRAM controller includes an arbitrator circuit 151 connected to receive the OREQ signals produced by the flip-flop 54, the digitizer interface port 40, the microprocessor interface port 42 and the display interface port 44 of FIG. 4. The arbitrator circuit 151 is a state machine, clocked by the SYSCLK signal and reset by a system reset signal SRST, and is adapted to generate one of a set of six memory access request output signals in response to the input request signals. One output request signal (RFRSH) is applied as input to a refresh state machine (RSM) 152 which initiates the refresh of the odd memory bank in response to the RFRSH input signal. Another request output signal (RMPU) of arbitrator 151 is applied as input to state machine (MPUSM) 154 which controls access to the odd memory bank for a read or write request from the microprocessor interface port 42 of FIG. 4. The remaining four request signals (RDIG, WDIG, RDIS, and WDIS) produced by the arbitrator circuit 151 drive inputs of a third state machine (GPSM) 156 which controls access to the odd memory bank in response to memory read and write requests from the digitizer and display interface ports 40 and 44 of FIG. 4. State machines 152, 154 and 156 are all clocked by the system clock SYSCLK and may be reset by the system reset signal SRST.

The MPU ADDR bits A2–A17 and SAG ADDR lines A1–A16 from the microprocessor interface port 42, the DIG ADDR lines A1–A16 from the digitizer interface port 40 of FIG. 4 and eight address lines A1–A8 from the refresh state machine 152 are applied as inputs to a 56×8 bit address multiplexer 158 which selectively transmits either the most significant or the least significant eight bits of one of the three 16 bit input addresses or the eight bits of the address from the refresh state machine 152 on the address bus 15 connected to each DRAM chip of the odd DRAM bank 16a of FIG. 2. The A0 and A18 MPU ADDR bits, the A17 SAG ADDR bit, and the A17 DIG ADDR bit, along with CAS signals generated by state machines 154 and 156, provide inputs to a CAS signal decoder 164 which produces the HHCAS*, HLCAS*, LHCAS*, and LLCAS* signals for column address strobing the DRAM bank of FIG. 2 according to the states of the decoder inputs. The 16 incoming and 16 outgoing DIG DATA lines from the digitizer interface port, the 16 MPU data lines from the microprocessor interface port, and the 16 DIS DATA lines from the display interface port are selectively connected to the data lines 17 of the odd DRAM bank 16a of FIG. 2 through a buffer circuit 166 acting as a bidirectional data multiplexer.

The arbitrator circuit 151 gives a refresh request highest priority. When it detects a refresh OREQ input signal, it transmits the RFRSH signal to refresh state machine 152 which subsequently transmits an address control signal (ACON) to address multiplexer 158 causing the multiplexer to select the eight address lines from the refresh state machine 152. The refresh state machine then transmits a sequence of memory addresses to odd DRAM bank 16a via multiplexer 158 and sends a sequence of RAS signals to a NOR gate 160, causing the NOR gate to assert the RAS* signal applied to each DRAM chip 32-39 in the odd memory bank 16a of FIG. 2 after each address change to refresh each DRAM chip.

The arbitrator circuit 151 gives an OREQ signal from the microprocessor interface port next highest priority. After receipt of an OREQ signal from the microprocessor interface port, in the absence of a refresh request, it transmits the RMPU signal to state machine 154. The READ and WRITE output signals of the microprocessor interface port 42 of FIG. 5 are also applied as inputs to state machine 154 to indicate whether the memory access is to be a read or a write operation and to indicate whether the access is for an eight bit or sixteen bit data word. On receipt of the RMPU signal, state machine 154 asserts or deasserts a write control R/W* signal output according to whether the WRITE and READ signal inputs indicate a write or a read operation. The R/W* signal is input to a NOR gate 162 which produces the WRITE* control signal applied to the odd DRAM bank. The state machine 154 also transmits an address control signal ACON to address multiplexer 158 which causes the multiplexer to place the eight least significant bits on the MPU ADDR lines on the ADDR bus 15 to the odd DRAM bank and then asserts a RAS output signal applied to an input of NOR gate 160 to initiate the RAS* signal which row address strobes the DRAM bank. The state machine 154 then switches the address multiplexer 154 to place the eight most significant address bits of the MPU ADDR lines on the odd DRAM bank address bus 15 and transmits one of two single bit direction control signals (DIR) to buffer circuit 166 causing the buffer circuit to connect the MPU DATA bus to the DRAM data bus 17 for either a data read or write transmission. The data flow direction is determined by the states of the READ and WRITE inputs to the state machine 154. The state machine 154 then transmits a CAS signal to CAS decoder 164. The CAS signal, in combination with the state of the A0 and A18 bit, causes the CAS decoder 164 to generate the appropriate one or two CAS* output signals required to column address strobe the eight or sixteen bit memory storage location being accessed by the microprocessor. If the WRITE* signal output of state machine 154 is asserted, the odd DRAM bank then responds by reading the eight or sixteen bit data from memory onto the data bus 17 and if the WRITE* signal is not asserted, the odd DRAM bank responds by writing the eight or sixteen bit data on the data bus 17 into memory. After asserting the CAS signal, the state machine 154 transmits the READY signal to the microprocessor interface port 42 of FIG. 5 to indicate, in the case of a memory read operation, that data has been placed on the data bus, or to indicate, in the case of a memory write operation, that the data has been written into memory.

When state machine 156 receives an RDIG signal, it transmits an address control output signal ACON to the address multiplexer 158 which causes the address multiplexer to place the lower order eight bits on the DIG ADDR lines on the ADDR bus to the odd DRAM bank and asserts an R/W* output signal to NOR gate 162, causing the NOR gate to deassert the WRITE* signal. State machine 156 then transmits a RAS signal to NOR gate 160 causing it to assert the RAS* signal to row address strobe the odd DRAM bank. Thereafter state machine 156 switches the state of address multiplexer 158 to place the eight highest address bits on the DIG ADDR lines on the ADDR lines 15 to the odd DRAM bank, transmits one of four single bit DIR signals to buffer 166 to connect the DIG DATA lines to the DRAM DATA bus 17 for a data read operation, and then asserts a CAS signal input to the CAS decoder 164, causing the CAS decoder to assert either the HHCAS* and HLCAS* signals or the LHCAS* and LLCAS* signals as determined by the state of the A17 bit on the DIG ADDR bus. The output of CAS decoder 164 column address strobes the odd DRAM bank, whereby the DRAM bank places the addressed data on the DATA bus 17. The state machine 156 then transmits an end of word (EOW) signal to the digitizer interface port 40 of FIG. 4 indicating that the data is on the bus.

When state machine 156 receives an RDIS, RDIG or WDIG signal, it transmits an address control output signal ACON to the address multiplexer 158 and the address multiplexer places the lower order eight bits on the SAG ADDR bus on the ADDR bus 15 to the odd DRAM bank. If the RDIS signal was received, state machine 156 asserts an R/W* output signal to NOR gate 162, whereby the NOR gate deasserts the WRITE* signal. State machine 156 then transmits its RAS output signal to NOR gate 160 and NOR gate 160 asserts the RAS* signal to row address strobe the odd DRAM bank. Thereafter state machine 156 switches the state of address multiplexer 158 to place the eight highest address bits on the SAG ADDR lines on the ADDR bus 15 to the odd DRAM bank. State machine 156 then transmits the appropriate one of four of its single bit output DIR signals to buffer 166 to connect either the DIG DATA or the DIS lines (depending on whether an RDIS, RDIG or WDIG signal was asserted) to the DRAM bank DATA bus 17 for the indicated data read or data write operation, and asserts a CAS signal input to the CAS decoder 164, causing the CAS decoder to assert either the HHCAS* and HLCAS* signals or the LHCAS* and LLCAS* signals, as determined by the state of the A17 bit on the SAG ADDR lines also applied as input to the CAS decoder. The output of CAS decoder 164 column address strobes the appropriate chips in the odd DRAM bank, prompting the DRAM bank to read or write the data on the odd DRAM bank DATA bus. The state machine 156 then transmits an end of word (EOW) to the digitizer and display interface ports 40 and 44 of FIG. 4 indicating that the data is on the DATA bus 17 (in the case of a read request) or that the data has been written to memory (in the case of a write request).

Referring to FIGS. 1 and 4, the separation of the waveform memory into independently accessible odd and even banks 16a and 16b, and the use of DRAM controllers 46 and 48 to independently access each bank, permits two data processing devices such as display controller 18, microprocessor 24 or digitizer 12 to access the waveform memory 16 at the same time. When, for example, digitizer 12 and microprocessor 24 each attempt to write sequences of waveform data into the waveform memory 16 at the same time, the even and odd DRAM controllers in MMU 14 arbitrate access to the banks in an alternating fashion such that during one memory access cycle, the microprocessor writes a data word to an odd address in the odd bank while the digitizer writes a data word to an even address in the even bank. During a next memory access cycle, the microprocessor writes the next word of its data sequence to an even address in the even bank while the digitizer writes the next data word of its data sequence to an odd memory address in the odd bank. Thus each processing device is able to read or write a data sequence to sequential memory addresses without substantially interfering with the rate at which the other device reads or writes a data sequence out of or into the memory.

Memory management unit 14 is also described and claimed in copending application Ser. No. 06/912,024, entitled "Even/Odd Waveform and Message Controller", filed Sept. 25, 1986 and assigned to the assignee of the present invention.

Figure 9A:
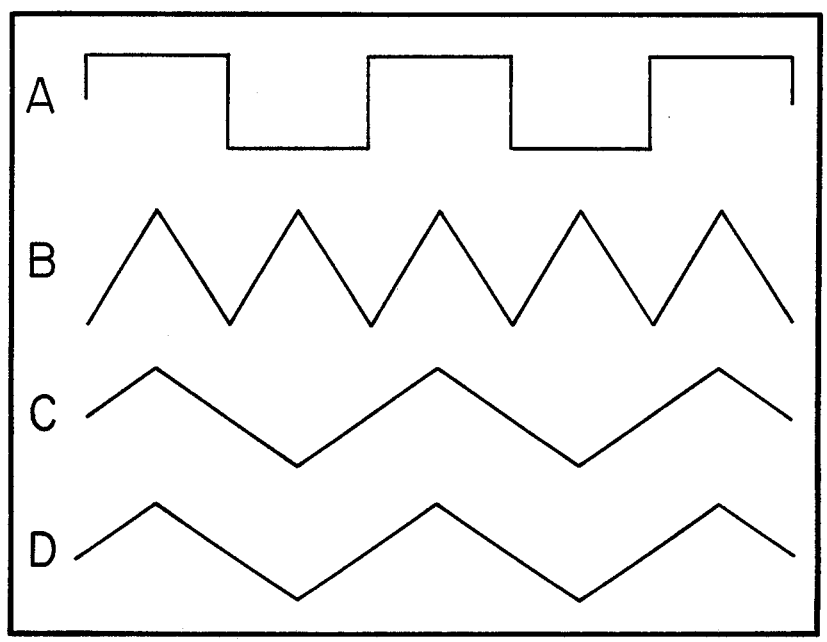
FIGS. 9A–9D illustrate a sequence of displays of input waveforms and a processed waveform produced by the computer-based oscilloscope of FIG. 1, the processed waveform display being computed from input waveform data in a sequential fashion.

FIG. 9A depicts a typical waveform display on screen 22 of oscilloscope 10 of FIG. 1 including three digitized waveforms A, B and C and one processed waveform D. A user may, for example, wish to display a processed waveform representing the product of two digitized waveforms. This is helpful for instance, in checking the response of an analog multiplier circuit which generates an output waveform proportional to the product of two input waveforms. To do so, the user connects the two multiplier input waveforms including, for instance, a square wave (waveform A) oscillating between +1 volt and −1 volt, a sawtooth wave (waveform B) of the same frequency oscillating between 0 volts and 1 volt and the sawtooth multiplier output (waveform C) as inputs to digitizer 12 of FIG. 1. The digitizer continuously digitizes these waveforms and transmits the digitized waveform data sequences to memory management unit 14 which stores the waveform data sequences in waveform memory 16. When the operator specifies that the three digitized waveforms A, B and C are to be displayed on CRT 22, the microprocessor 24 tells the memory management unit 14 to periodically transmit the appropriate waveform data in memory 16 to display controller 18 which then produces the A, B and C waveform displays on CRT 22. Whenever one of the input waveforms changes, the data produced by digitizer 12 changes, causing a change in the data stored in waveform memory 16. Since the waveform display is periodically updated, the change in input waveform is subsequently reflected by a change in the displayed waveform.

The operator also specifies a mathematical expression for creating a processed waveform D according to the following format:

$$D = M \times A \times B. \qquad [1]$$

In this expression, the character A is a code identifying the stored data sequence in waveform memory 16 representing multiplier circuit input waveform A, B is a code identifying the stored data sequence representing the other multiplier circuit input waveform B, D is a code identifying the processed waveform data sequence and M is a selected constant. The expression tells the microprocessor 24 to compute the product of corresponding data of stored data sequences representing digitized waveforms A and B, to multiply the product by a scaling factor M, and to store the result as a processed waveform data sequence D in waveform memory 16. The value of the scaling factor M may, for instance, be determined by the setting of a user input device 26 such as a control knob which the operator may adjust to simulate any signal attenuation or amplification of the multiplier circuit under test.

The computer periodically recomputes the waveform data sequence D stored in waveform memory 16 of FIG. 1 in accordance with equation using the last user-provided value of M and the most recent versions of digitized data sequences A and B stored in the waveform memory. As each element of data sequence D is recomputed, the result of the recomputation is written into waveform memory 16 replacing the last computed value of the element.

When the operator tells the oscilloscope 10 to display processed waveform D in addition to the two multiplier circuit input waveforms A and B and the multiplier circuit output waveform C, the computer periodically transfers waveform data sequences A, B, C and D from waveform memory 16 to display controller 18 of FIG. 1. In response, the controller 18 updates display control data in display memory 19 so that when the controller 18 next refreshes the display on CRT 22 in accordance with the display control data in memory 19, displays of waveforms A, C, and D on CRT 22 are updated to reflect changes in the underlying waveform data sequences last transferred from waveform memory 16 to the display controller. The operator can easily observe not only the relationships between the multiplier circuit input and output signals but also how the actual output waveform C deviates from the "expected" multiplier circuit output waveform D. Since the display of processed waveform D is updated periodically, any change in an input waveform A or B or in the scaling factor M causes a subsequent corresponding change in the processed waveform display D. The operator may adjust the control knob to change the value of M so that the amplitude of the processed waveform D matches the amplitude of the actual multiplier circuit output waveform C. Since any electronic circuit can be modeled by transfer functions relating its outputs to its inputs, and since the microprocessor 24 can be programmed to combine sequences of stored waveform data according to a wide variety of mathematical expressions, oscilloscope 10 can produce and display corresponding "expected" and "actual" output waveforms for a wide variety of electronic circuits.

When an input data sequence A or B changes, or when the operator alters the value of M, the microprocessor 24 requires a certain amount of time to acquire input waveform data from waveform memory 16, to process the input data according to the user-defined equation, and to transmit the processed data back to the waveform memory. Therefore the change to the processed waveform data in response to a change in input data, or to a change in a user-controlled parameter affecting the processed waveform, is not immediate. The recalculation time can be relatively long compared to the time it takes for digitizer 12 to generate waveform sample data, and compared to the time between CRT 22 display updates. Therefore the oscilloscope 10 takes a noticeably long time to change the display of the processed waveform in response to a change in an input waveform or a user controlled parameter upon which the processed waveform computation is based.

This display update delay can be troublesome. For instance when an operator wishes to change the amplitude of the processed waveform D of FIG. 9A by utilizing a control knob to adjust the value of the M parameter in the mathematical expression [1] above, the change in the amplitude of the displayed waveform would lag the movement of the knob by a considerable delay period and the operator would have to make a series of knob adjustments, waiting for the display to change between each adjustment, in order to set the processed waveform to a desired level. Consequently, such an adjustment process can be time consuming and somewhat frustrating. Also while a displayed processed waveform is being recomputed after a change in input data or a user controlled parameter, the displayed waveform is based partly on the pre-change values of the input data and partly on the post-change values of the input data or parameter. When the data representing a processed waveform is recomputed in sequential order, the change to the displayed waveform appears to "snake" across the screen as successive sections of the waveform are recomputed between each screen update.

Figure 9B:
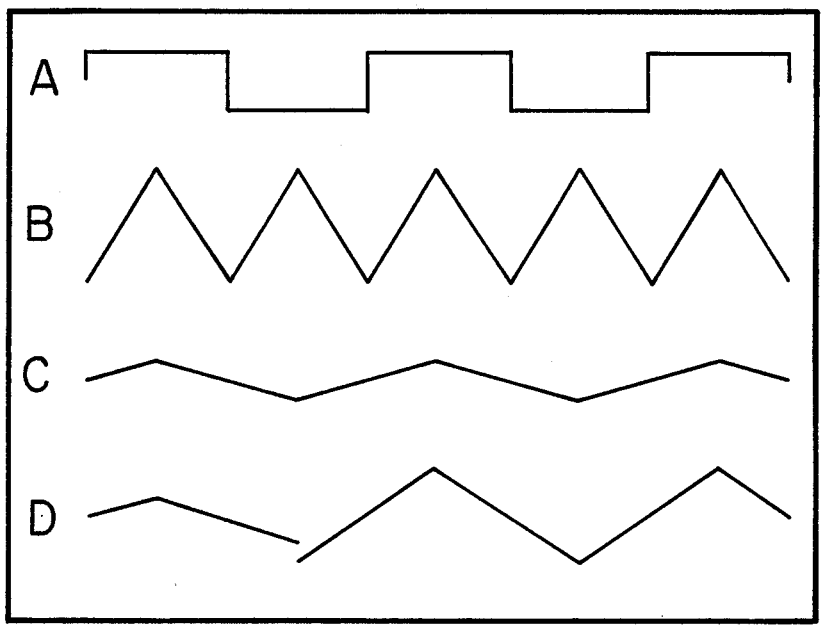
Figure 9C:
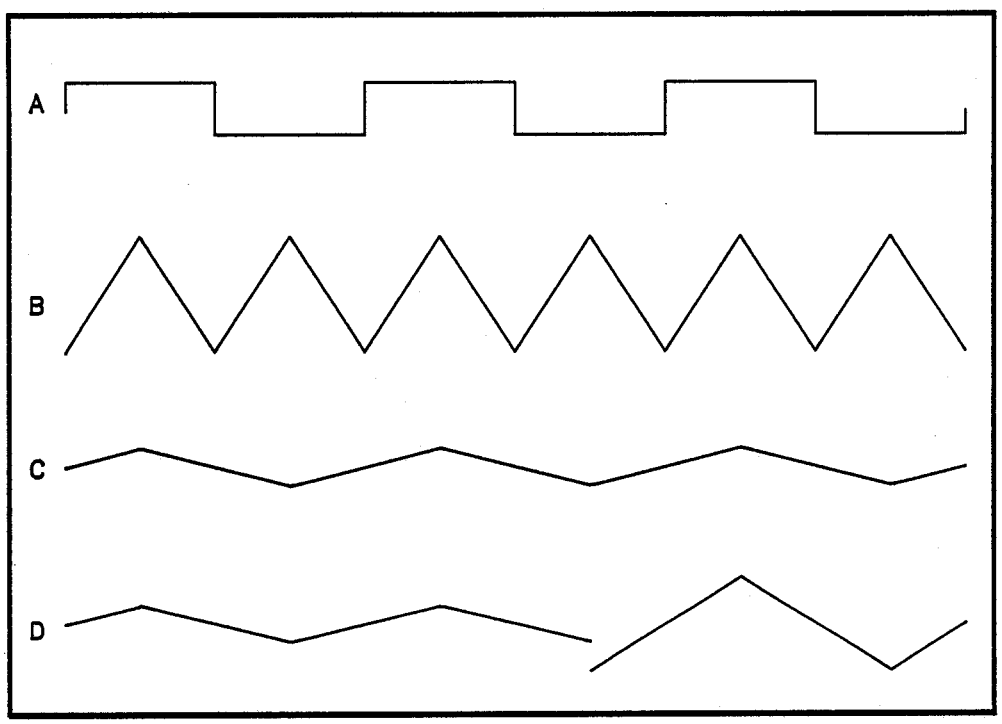
Figure 9D:
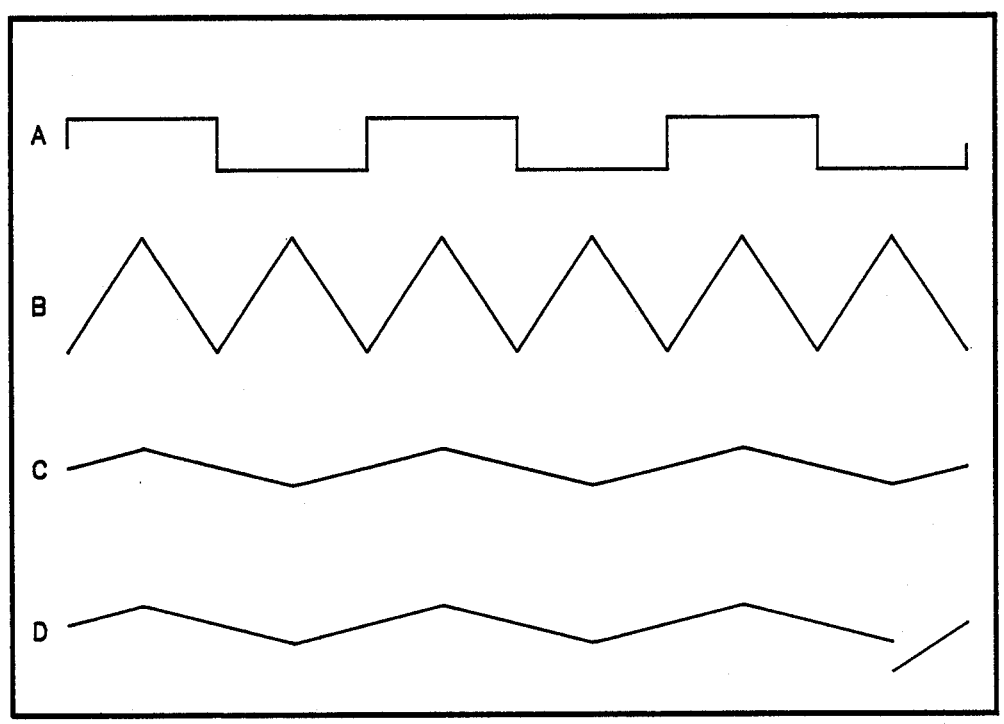

FIGS. 9B–9D show a succession of waveform displays following a reduction in the amplitude of the input waveform A shown in FIG. 9A when the processed waveform is recomputed sequentially. FIG. 9B shows the waveform display a short time after the amplitude of the square wave input waveform A is reduced. The displays of digitized waveforms have changed from that shown in FIG. 9A to reflect the reduction in amplitude of the multiplier input waveform A and the resulting reduction in amplitude of the multiple output waveform C. The display of only the first cycle of processed waveform D has been changed to reflect the change in multiplier input waveform A because the microprocessor has had only enough time to recompute and update the stored waveform data associated with the first cycle of waveform D. FIG. 9C shows the waveform display a short time after the display of FIG. 9B. At this point the microprocessor has had time to recompute and update the display of the second cycle of waveform D. FIG. 9D shows a still later display of waveform D after the microprocessor has recomputed and updated the display of the third cycle of waveform D. As can be seen from FIGS. 9B-9D, the update of the display of processed waveform D "snakes" across the screen and this "snaking" of the update can be distracting to a viewer. Since input waveform C is produced by an analog multiplier, it typically changes quickly in response to a change in input waveform a. The changed waveform C is then quickly digitized to update the waveform data stored in the waveform memory. Thus, waveform data representing the response of input signal C to a change in input signal A is updated quickly in comparison to the time required for recomputation of the data sequence associated with waveform D by microprocessor 24. The waveform data controlling display of waveform C is normally fully updated within one or two display refresh cycles after a change in A and snaking in waveform C is normally not apparent.

In order to eliminate the snaking of the display update, and to provide a rapid indication to a viewer of the change throughout the entire length of a processed waveform, the processed waveform data is recomputed during successive "equivalent time computation passes" according to the present invention. During each equivalent time computation pass, every Nth data of the processed waveform data sequence is recomputed. The first waveform data recomputed during each computation pass is selected such that each data in the waveform data sequence is computed once every N computation passes whereby when the input waveform data changes, the waveform display will be completely updated after N equivalent time calculation passes.

Figure 10A:
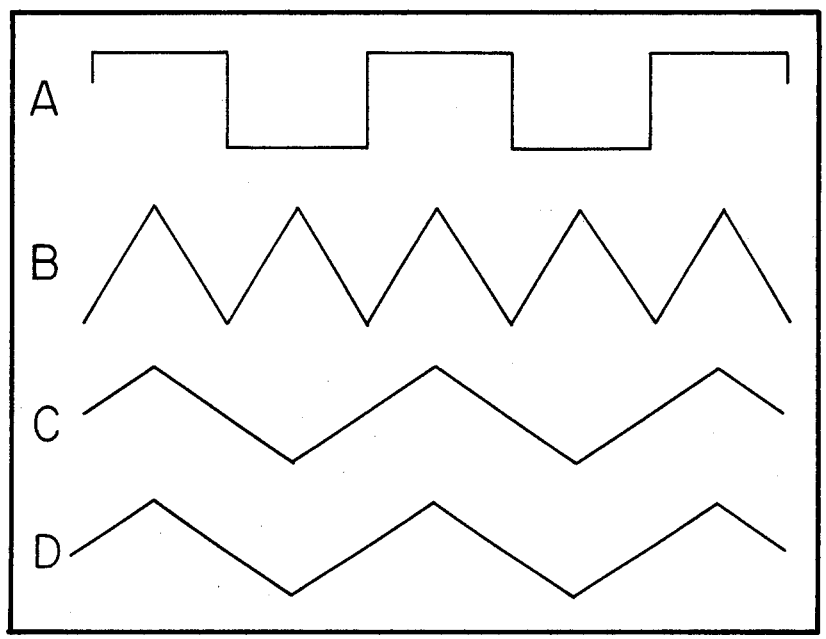
FIGS. 10A–10D illustrate a sequence of displays of input waveforms and a processed waveform produced by the computer-based oscilloscope of FIG. 1, the processed waveform display being computed from input waveform data during successive equivalent time computation passes.
Figure 10B:
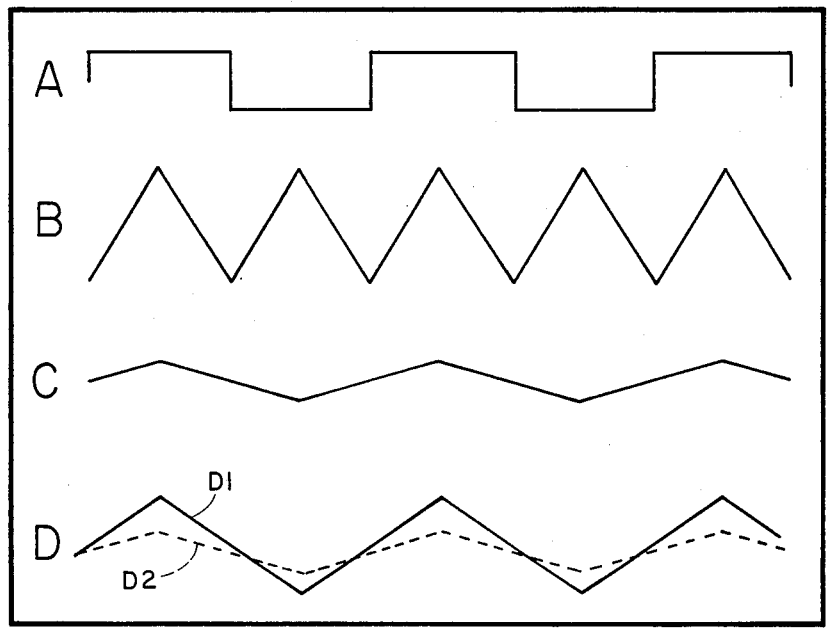

FIGS. 10A-10D illustrate a sequence of waveform displays illustrating a change in input waveform A similar to the sequence of FIGS. 9A-9D except that data for the processed waveform D has been recomputed utilizing equivalent time computation passes rather than sequentially as in FIGS. 9A-9D. FIG. 10A shows the display of waveforms A-D before a change to multiplier circuit input waveform A. FIG. 10B shows the display of the waveforms a short time later after the microprocessor has performed a first equivalent time computation pass. The changes in digitized waveform A and C have caused a corresponding change in the display of these waveforms and the display of the processed waveform D has been partially updated because every Nth data point has been recomputed during the first equivalent time computation pass. The recomputed data points form an outline ("postchange" waveform D2) of the processed waveform as it will appear later when all of the data points have been recomputed during subsequent equivalent time computation passes. As the waveform data is recomputed, points along the "prechange" waveform D1 disappear, and waveform D1 begins to fade from view.

Figure 10C:
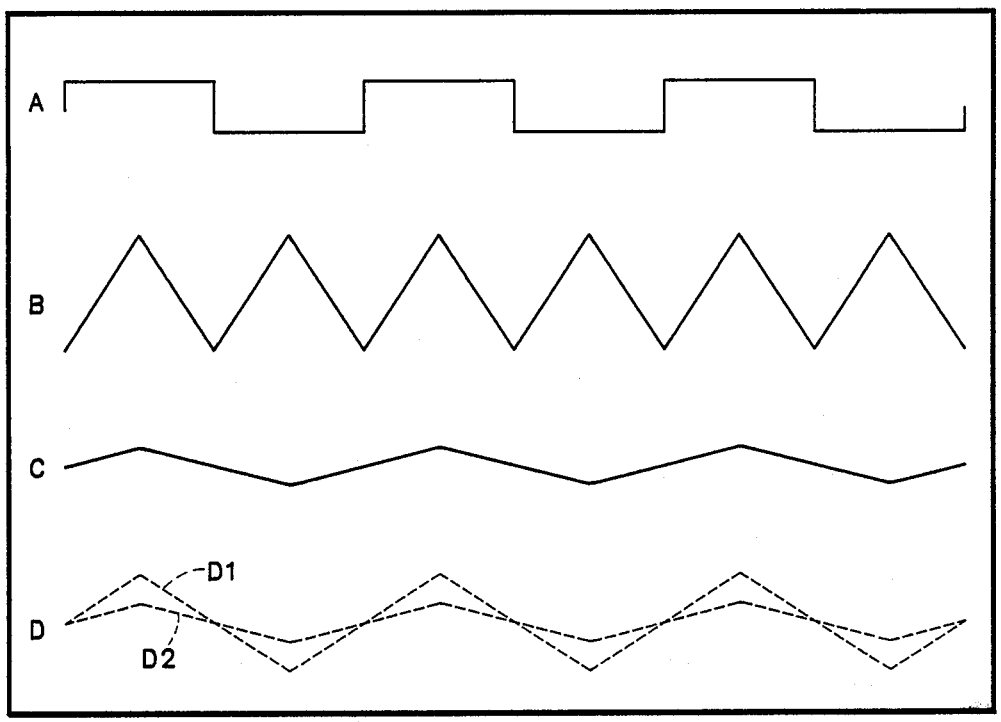
Figure 10D:
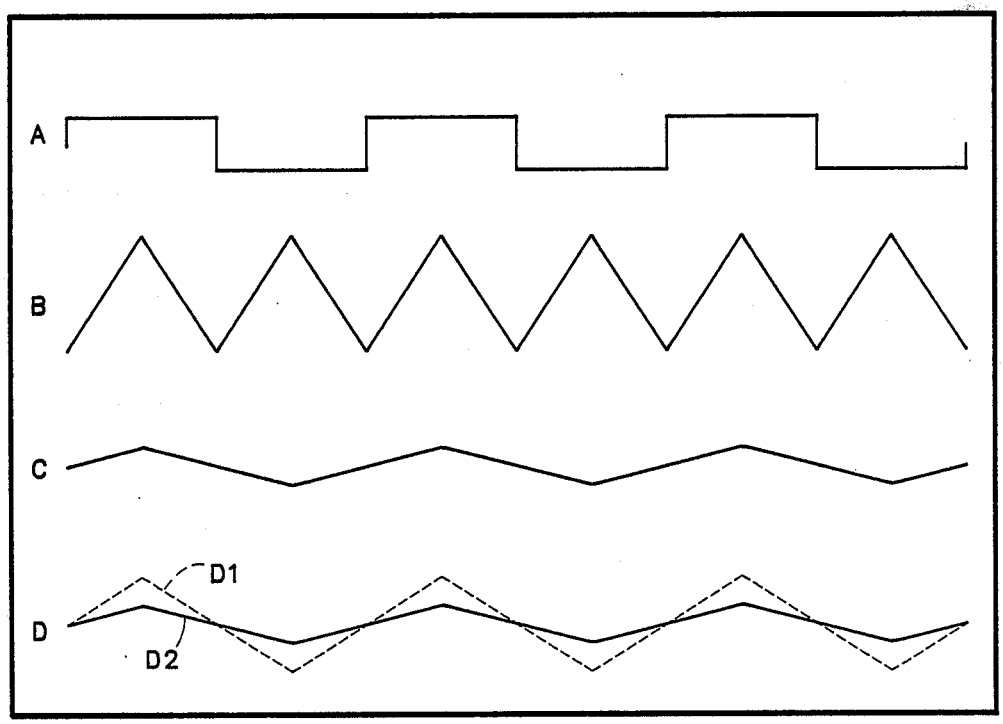

FIG. 10C shows the display of waveform D after the microprocessor has performed several more equivalent time computation passes. At this time about half of the data points for the waveform have been recomputed. The prechange waveform D1 and the postchange waveform D2 appear to have about the same density since they are made up of about the same number of data points. FIG. 10D shows the display of waveform D just before the last (Nth) equivalent time computation pass wherein the postchange waveform D2 is almost solidly filled in while the prechange waveform D1 has nearly faded from view. After the next computation pass waveform D2 will be completely filled in and waveform D1 will disappear. Thus when the data of the processed waveform is recomputed utilizing equivalent time passes according to the present invention, the snaking of the processed waveform update across the screen is eliminated and the entire postchange waveform display appears to "fade in" while the prechange waveform appears to "fade out". This fade in/fade-out display change is much less distracting to a viewer than a snaking display change. Moreover, the equivalent time pass method of display update permits the operator to see an outline such as outline D2 of FIG. 10B of the entire postchange waveform D almost immediately after the change to the input data. Of course, when input waveform a is constantly and rapidly changing, the display of both waveforms C and D also constantly change. When input waveform a changes more frequency than waveform sequence D can be fully recomputed, the displayed waveform D exhibits a constantly changing "fuzzy" pattern as it attempts to track the changes in A. However, once input waveform a stops changing, the display of waveform D quickly settles to a consistent, continuous pattern.

The value of N determines the number of computation passes required to completely recompute a waveform data sequence and is preferably chosen such that the duration of each computation pass is less than the period between display updates. This ensures that the outline of the entire waveform is based on data computed during the first computation pass and is therefore displayed within one or two screen updates following a change in a parameter in the mathematical expression defining the waveform. The rapidly displayed outline gives an operator monitoring the waveform substantially visual feedback indicating how the recomputed waveform will ultimately appear after all the processed waveform data has been recomputed. When the value of N is adjusted such that the duration of each computation pass is substantially equal to the period between display updates, a maximum amount of waveform data is recomputed between display updates.

The position within the processed waveform data sequence of the first data to be recomputed during each successive computation pass is selected in a pseudorandom fashion so that the order of update of displayed points of successive waveform points is not readily apparent to an observer. While the use of equivalent time computation passes between each screen update eliminates "snaking" of the waveform update across the screen, the pseudo-random selection of first data for each computation pass eliminates the appearance of snaking or other distracting patterns in the update of successive sections of the waveform.

Figure 11:
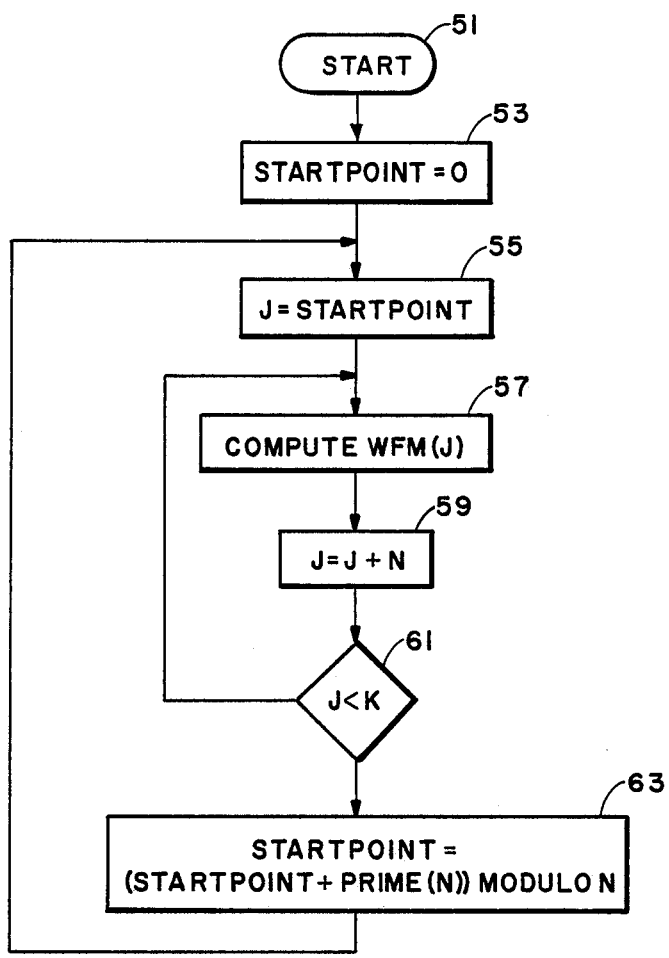
FIG. 11 is a flow chart for a computer program for calculating waveform data according to a pseudorandom, equivalent time method of data point.

FIG. 11 is a flow chart of a program for the microprocessor 24 of FIG. 1 for recomputing the processed waveform data utilizing equivalent time passes wherein the starting data for each pass is selected in a pseudorandom fashion. For a waveform represented by a sequence of K computed data values, the variable J in FIG. 11 indicates a waveform data sequence position from 0 to $K-1$ where the first data of the sequence is at sequence position $J=0$ and the last data of the sequence is at position $J=K-1$. The number of equivalent time computation passes required to recompute all data of the sequence is represented by the constant N. The waveform data sequence position of the first waveform data to be recomputed during an equivalent time computation pass is indicated by the value of a variable "STARTPOINT" and the value of the computed waveform data at any sequence position J is indicated by the variable WFM(J). The computation process starts in block 51, and then in block 53 the STARTPOINT variable is initialized to zero. The J variable is set equal to STARTPOINT (block and the value of the waveform data for sequence position J, WFM(J), is computed (block 57) according to a user provided mathematical expression. The value of J is incremented by the value of N in block 59 and, if J is less than K (block 61), the value of the waveform data WFM(J) at the new sequence position J is computed in block 57. J is incremented once again in block 59, and the process of computing the value of WFM(J) and incrementing J by N continues until J is greater than or equal to K (block 61) indicating the completion of one equivalent time computation pass. At this point a new value is assigned to STARTPOINT (block 63) and another equivalent time computation pass is initiated beginning in block 55 where J is set to the new STARTPOINT value.

The equation in block 63 which alters the value of STARTPOINT at the end of each equivalent time computation pass is designed to ensure that the waveform data sequence position of the first data recomputed during each successive computation pass is selected in a pseudorandom fashion so that an operator observing the "fade in" of an updated waveform display would perceive no apparent pattern in the way the waveform data points are filled in. Specifically, in block 63 the new STARTPOINT value is set according to the following expression:

STARTPOINT=(STARTPOINT+RPRIME(N)) MODULO N

According to this expression, the new value of STARTPOINT is computed according to the following steps:
1. sum the old value of STARTPOINT and a number RPRIME(N),
2. divide the sum by N, and
3. set the value of STARTPOINT to the remainder.

The expression "MODULO N" indicates the latter two steps. The value of RPRIME(N) is 1 if N is less than 4. If N is 4 or larger, the number RPRIME(N) is selected from among the set of "relative primes" of N. Each positive integer less than N is a "relative prime" of N provided the integer is not a multiple of an integer other than 1 which can be divided evenly into N. For example the relative primes of the number 10 are 3, 7 and 9. The numbers 2 and 5 are not relative primes because they can evenly divide 10. The numbers 4, 6 and 8 are not relative primes of 10 because they are multiples of 2, and 2 can evenly divide 10. As another example, all of the numbers between 1 and 11 are relative primes of 11 because none of the numbers 2-10 can evenly divide into 11.

When RPRIME(N) is a relative prime of N, the algorithm flowcharted in FIG. 11 ensures that the data at each one of the first N waveform data sequence positions will be selected as the first data to be recomputed during every Nth equivalent time computation pass. Assume for example that the calculated waveform is made up of 100 data points and that the waveform is to be completely recomputed every 10 computation passes. Thus N=10 and K=100. Assume also that the RPRIME(10) is chosen to be 7, a relative prime of 10. During the first computation pass the microprocessor initially recomputes waveform data at position J=0 and then sequentially recomputes data at positions 10, 20, 30 ... 90. Then in block 62, the STARTPOINT variable is set to the value 7 since the remainder of 0+7 divided by 10 is equal to 7. Thereafter, during the next computation pass, the data at sequence positions 7, 17, 27, 37, ... 97 are computed. STARTPOINT is then set to 4 (the remainder of 7+7 divided by 10) and another computation pass begins in block 54. As the process continues, the starting points of the first 10 computation passes are selected accordingly in the following order: (0, 7, 4, 1, 8, 5, 2, 9, 6, 3). Note that all of the numbers from 0 through 9 are chosen as starting points and that no number is repeated. The choice of a relative prime as the value of RPRIME(N) ensures that each integer from 0 to N−1 will be selected as a starting point once every N computation passes thereby ensuring that every data point of the waveform will be computed once every Nth pass.

It is beneficial to select the computation pass starting points so that the data points within each section of N data points along the waveform display are computed in a pseudorandom order whereby an operator viewing the "fade in" of a recomputed waveform will not be distracted by any perceived pattern in the way sections of the waveform are filled in. Most numbers N have more than one relative prime and some relative primes are better choices than others for the value of RPRIME(N) in that they produce fill in patterns which are more random appearing than others. The following Table I lists acceptable choices for the value of RPRIME(N) for values of N from 1 to 100:

TABLE I

| N:RPRIME(N) | N:RPRIME(N) |
|---|---|
| 1:1 | 51:28 |
| 2:1 | 52:33 |
| 3:1 | 53:30 |
| 4:3 | 54:35 |
| 5:3 | 55:34 |
| 6:5 | 56:33 |
| 7:4 | 57:32 |
| 8:5 | 58:41 |
| 9:5 | 59:33 |
| 10:7 | 60:37 |
| 11:7 | 61:36 |
| 12:7 | 62:35 |
| 13:8 | 63:37 |
| 14:9 | 64:37 |
| 15:11 | 65:41 |
| 16:9 | 66:37 |
| 17:10 | 67:41 |
| 18:11 | 68:43 |
| 19:11 | 69:40 |
| 20:11 | 70:41 |
| 21:13 | 71:41 |
| 22:13 | 72:53 |
| 23:13 | 73:46 |
| 24:17 | 74:43 |
| 25:14 | 75:44 |
| 26:15 | 76:47 |
| 27:17 | 77:43 |
| 28:15 | 78:43 |
| 29:17 | 79:49 |
| 30:19 | 80:49 |
| 31:18 | 81:47 |
| 32:23 | 82:45 |
| 33:23 | 83:47 |
| 34:21 | 84:47 |
| 35:22 | 85:48 |
| 36:23 | 86:55 |
| 37:23 | 87:55 |

TABLE I-continued

| N:RPRIME(N) | N:RPRIME(N) |
|---|---|
| 38:21 | 88:51 |
| 39:22 | 89:55 |
| 40:29 | 90:53 |
| 41:23 | 91:51 |
| 42:29 | 92:53 |
| 43:25 | 93:52 |
| 44:27 | 94:53 |
| 45:26 | 95:56 |
| 46:27 | 96:53 |
| 47:29 | 97:61 |
| 48:31 | 98:55 |
| 49:30 | 99:58 |
| 50:29 | 100:59 |

The data in this table is stored in ROM 30 of FIG. 1 and the stored data provides the value of RPRIME(N) during the waveform computation process. The RPRIME(N) values in Table I are chosen by testing all the relative primes of the corresponding number N, first according to a "displacement test" of the randomness of the sequence of starting points, and then according to a "direction test" of randomness. In the displacement test, the differences between each starting point and the nearest previous starting point are summed, the sum being the measure of randomness. For instance, N=10 has relative primes 3, 7 and 9. When the relative prime 3 is chosen, the resulting starting point sequence according to the flowchart of FIG. 11 is (0, 3, 6, 9, 2, 5, 8, 1, 4, 7). The differences between the position of each starting point and the nearest previous starting point are 3, 3, 3, 1, 1, 1, 1, 1, and 1. Therefore, according to the displacement test, the "randomness" of this sequence is assigned a value of 15, the sum of the differences. When the relative prime 7 is chosen, the starting point sequence is (0, 7, 4, 1, 8, 5, 2, 9, 6, 3) and the displacements between the position of each starting point and the nearest previous starting point are 7, 3, 3, 1, 1, 1, 1, 1, and 1 for a total of 19. Thus the relative prime 7 is a better choice than the relative prime 3 since it produces a more random appearing sequence, a fact which is easily confirmed by casual inspection of the starting point sequences produced by each relative prime.

When two or more relative primes give the same randomness value as a result of the displacement test, the randomness of the relative primes are further tested according to a "direction" test wherein a counter is incremented by one when a starting point position increases and decremented when the starting point position decreases as the starting point sequence progresses. The relative prime which produces the lowest absolute count value when each starting point position of the sequence has been checked is taken as producing the most random starting point sequence. For instance the starting point sequence (0, 7, 4, 1, 8, 5, 2, 9, 6, 3) results in a count of +1, −1, −1, 1 −1, −1, +1, −1, 1 +for a total direction test count of −1. According to the direction test, this sequence is more random than a sequence which would produce a net direction test count of lower than −1 or greater than +1. The RPRIME(N) values shown in Table I are chosen to maximize starting point sequence randomness according to the displacement and direction type randomness tests.

Following a change in digitized input waveform data, during the process of updating a processed waveform display according to the above described equivalent time waveform calculation method, two partially filled in waveforms such as waveforms D1 and D2 of FIG. 10C are displayed until all of the waveform data has been recomputed. In a second preferred embodiment of the invention, when the operator changes the setting of a knob or other input device which alters the value of a parameter of a mathematical expression utilized to compute a processed waveform, the display of the "pre-change" waveform D1 is suppressed immediately after the change in the parameter value. In the oscilloscope 10 of FIG. 1, when the value of a particular waveform data point is set to a special code 8000h (i.e., 8000 hexadecimal). the display controller 18 blanks the display of that point on the waveform. Thus when all of the data of a processed waveform data sequence is set to 8000h and the sequence is sent to display controller 18, the display controller blanks the display of the waveform on CRT 22. When microprocessor 24 determines that an operator has changed the setting of a knob or other user input device 26 which affects a mathematical expression for computing a processed waveform data sequence, the microprocessor 24 immediately sets the current value of each data of the sequence to 8000h by sending an 8000h to each address in waveform memory 16. The microprocessor can do this much more quickly than it can recompute each 15 waveform data point because it does not have to read data from the waveform memory and does not have to perform any computations. The waveform data sequence stored in the waveform memory 16 is then transmitted to display controller 18 and the display controller blanks the display of the waveform during the next display update cycle.

Figure 12A:
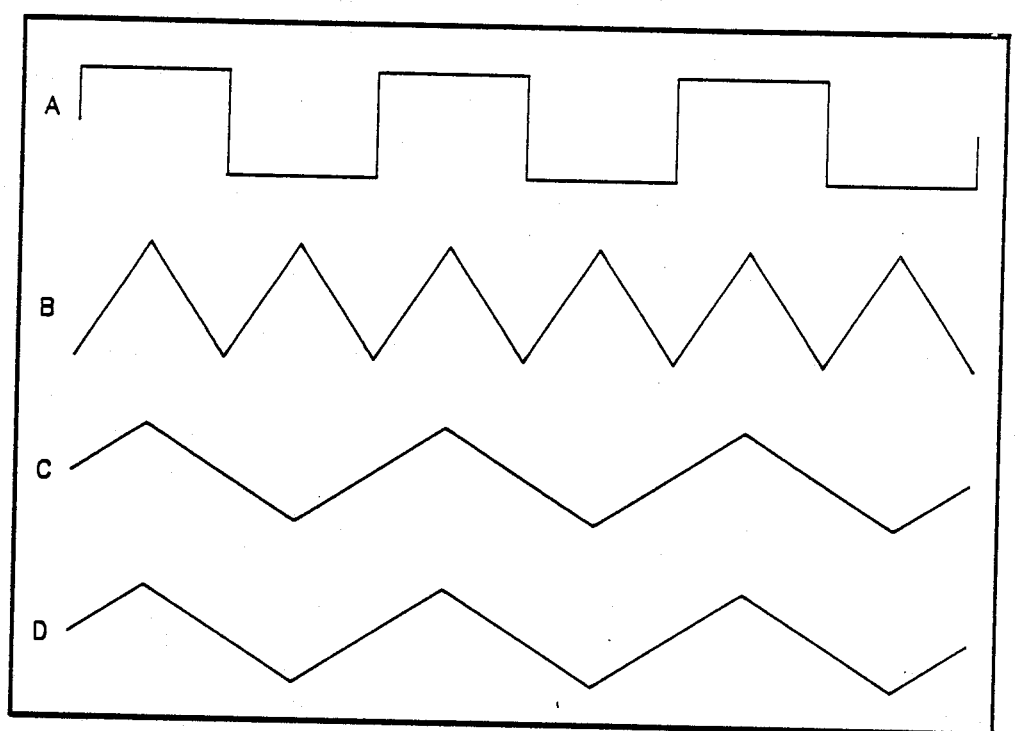
FIGS. 12A–12D illustrate another sequence of displays of input waveforms and a processed waveform produced by the computer-based oscilloscope of FIG. 1.
Figure 12B:
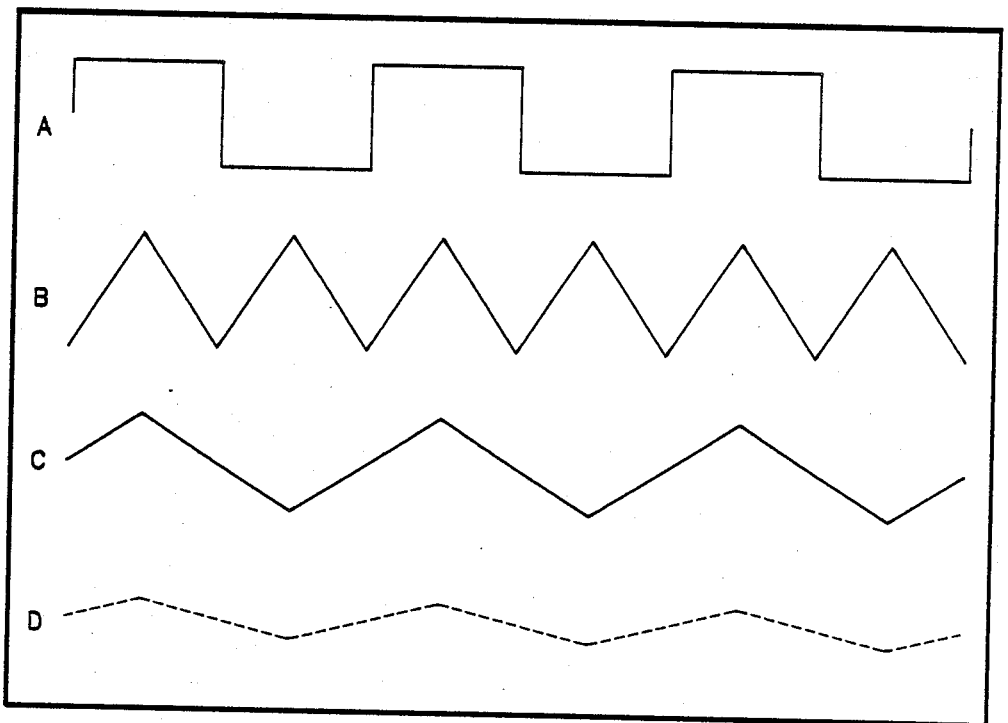
Figure 12C:
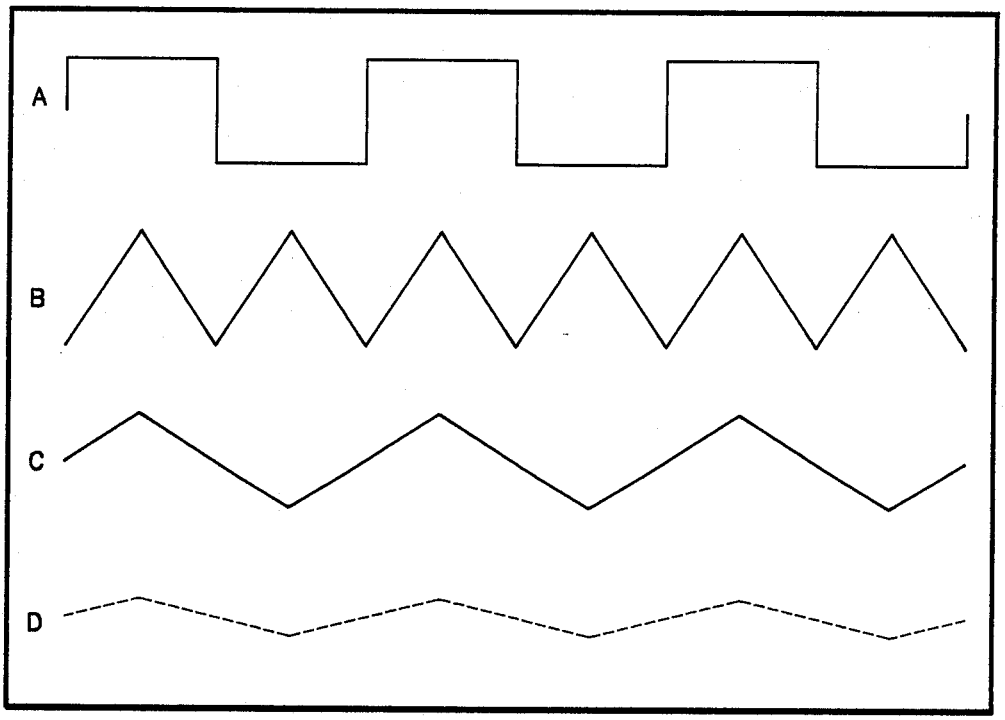
Figure 12D:
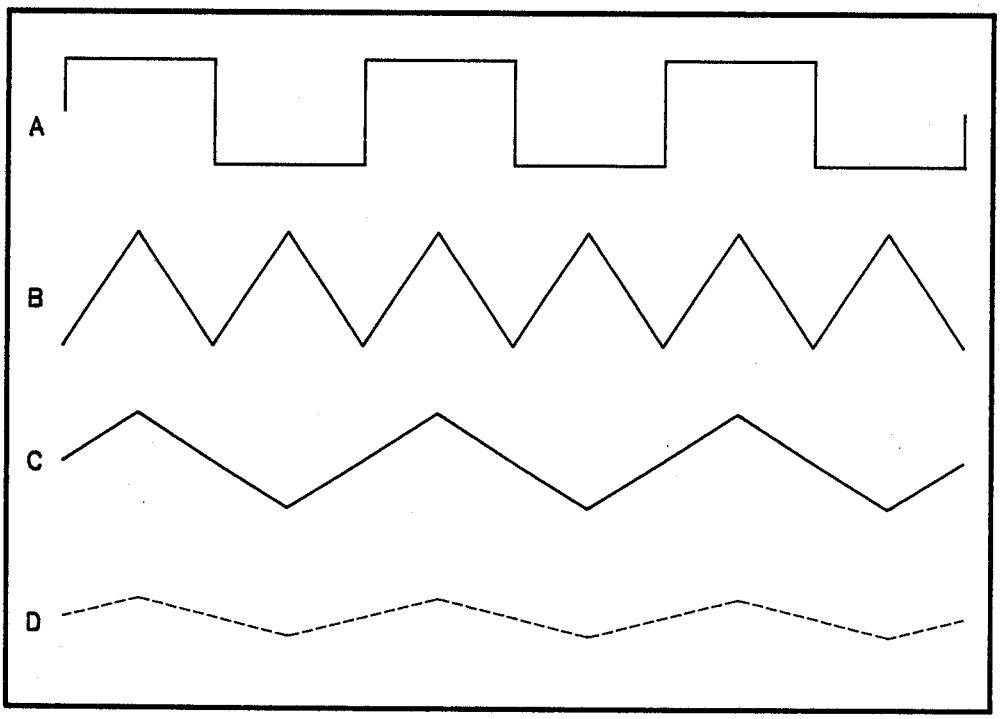

Thereafter, the microprocessor begins recomputing the waveform data sequence according to the equivalent time method described hereinabove to account for the change in the knob setting, and as each data point is recomputed, the blanking codes (8000h) stored in waveform memory 16 are replaced. After each equivalent time computation pass, the data sequence stored in the waveform memory is sent to the display controller 18 which then updates the display of the waveform to display the data points which have been thus far recomputed. Thus when the operator changes a setting of a knob or other input device, the display of any affected waveform immediately disappears and then slowly reappears as the waveform is recomputed. FIG. 12A shows a waveform display similar to that of FIG. 10A. As illustrated in FIG. 12B, after the operator provides input to microprocessor 24 of FIG. 1 indicating a reduction in the value of M, the display of waveform D is initially suppressed in the manner described hereinabove and as waveform data sequence D is thereafter recomputed in accordance with the new valve of M, a display of waveform D begins to reappear. FIG. 12C shows the new waveform D after additional computation passes have been made. After all values of waveform sequence D data elements have been recomputed, the display of waveform D is fully filled in as shown in FIG. 12 D.

Thus the waveform data display update method of the present invention provides a rapid indication of a change to a computed waveform displayed on a digital oscilloscope by recalculating the waveform during equivalent time computation passes performed between waveform display updates. The change to the waveform is evidenced after the first computation pass as an outline of the waveform displayed on the oscilloscope screen and the outline is progressively filled in after each computation pass. Distracting patterns in the order of the filling in of the waveform outline are eliminated by adjusting the starting point of each computation pass in a pseudorandom fashion. The display of a "prechange" waveform is blanked following a user input change so as to make it easier to see the initial outline of the "postchange" appearance of the waveform.

While preferred embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. In a system including computing means, memory means sequentially storing first data values forming a digital data sequence at a plurality of contiguous memory positions, and display means including a screen for producing a waveform display representing a digital data sequence provided thereto, a method for altering the digital data sequence and the waveform display, the method comprising the steps of:
   computing in said computing means according to a predetermined mathematical expression a plurality of second data values;
   writing the second data values to non-contiguous ones of said memory positions, thereby replacing ones of said first data values with computed second data values;
   providing the digital data sequence stored in said memory means to the display means; and
   repeating the steps of computing, writing and providing the digital data sequence.

2. The method in accordance with claim 1, wherein an overall duration of each cycle of computing, writing and providing lasts a predetermined period of time.

3. The method in accordance with claim 1, wherein said second data values are written to separate sets of said memory positions during each of a plurality of successive cycles of computing, writing and providing.

4. The method in accordance with claim 3, wherein said separate sets of memory positions are selected such that said second data is written to a contiguous subset of said memory positions in an non-sequential order during said successive cycles.

5. In a system including computing means, memory means sequentially storing first data values forming a digital data sequence at a plurality of contiguous memory positions, and display means including a screen periodically updating a waveform display in accordance with said data sequence provided to said display means between display updates, a method for altering the digital data sequence and the waveform display, the method comprising the steps of:
   computing in said computing means according to a predetermined mathematical expression a plurality of second data values;
   writing said second data values to said memory means, said second data values replacing ones of said first data values stored at non-contiguous ones of said memory positions;
   providing the digital data sequence stored in said memory means to the display means; and
   repeating the steps of computing, writing and providing the digital data sequence with an overall duration of each cycle of computing, writing and providing being substantially equal to a period between waveform display updates.

6. In a system including analog to digital conversion means, computing means, memory means sequentially storing first data values forming a digital data sequence at a plurality of contiguous memory positions, and display means including a screen periodically updating a waveform display in accordance with said data sequence provided to said display means between display updates, a method for altering the digital data sequence and the waveform display, comprising the steps of:
   computing in said computing means according to a predetermined mathematical expression a plurality of second data values;
   writing said second data values to said memory means, said second data values replacing ones of said first data values stored at non-contiguous ones of said memory positions;
   providing the digital data sequence stored in said memory means to the display means; and
   repeating the steps of computing, writing and providing the digital data sequence with an overall duration of each cycle of computing, writing and providing being substantially equal to a period between waveform display updates.

7. The method in accordance with claim 6, wherein separate sets of said first data values are replaced during each of a plurality of successive cycles of computing, writing and providing such that second data is written to a contiguous subset of said memory positions in a pseudo-random order during said successive cycles.

8. In a system including analog to digital conversion means, computing means, memory means sequentially storing first data values forming a first digital data sequence at a plurality of contiguous first memory positions in said memory means, and display means including a screen periodically updating a waveform display in accordance with said first data sequence provided to said display means between display updates, a method for altering the digital data sequence and the waveform display, comprising the steps of:
   sampling an input waveform and converting the input waveform to a second digital waveform data sequence;
   sequentially storing the second digital waveform data sequence at contiguous second memory positions in the memory means; and
   processing the second waveform data sequence for display on the screen in accordance with predetermined operations;
   wherein said processing for display in accordance with predetermined operations comprises the steps of:
   reading a plurality of second data values from non-contiguous ones of said second memory positions;
   computing in said computing means according to a predetermined mathematical expression a plurality of third data values;
   writing said third data values to said memory means, said third data values replacing ones of said first data values stored at non-contiguous ones of said first memory positions;
   providing the first digital data sequence stored in said memory means to the display means; and
   repeating the steps of reading computing, writing and providing the first digital data sequence, with an overall duration of each cycle of computing, writing and providing being substantially equal to a predetermined amount of time.

9. A method in accordance with claim 8, wherein said predetermined amount of time is substantially equal to a period between waveform display updates.

10. An apparatus for generating and displaying representations of waveforms, comprising:
  memory means sequentially storing data values forming a digital data sequence at contiguous memory positions;
  display means including a screen, said display means periodically generating a waveform display representing said digital data sequence on said screen in response to said digital data sequence; and
  computing means for repetitively computing a plurality of data values according to a predetermined mathematical expression, writing the computed data values to non-contiguous ones of said memory positions thereby replacing values of said digital data sequence with said computed data values, and providing the digital data sequence to the display means;
  said computing means replacing a different set of data values of said digital data sequence during each of a plurality of successive cycles of computing, writing and providing.

11. An apparatus for generating and displaying digital representations of waveforms, comprising:
  memory means for sequentially storing first data values forming a first digital data sequence at contiguous first memory positions and second data values forming a second digital data sequence at contiguous second memory positions;
  display means including a screen, for producing a waveform display representative of said first digital data sequence when said first digital data sequence is provided to said display means; and
  computing means for repetitively reading a plurality of said second data values from non-contiguous ones of said second memory positions, computing according to a predetermined mathematical expression third data values for the first data values read, writing said third data values to non-contiguous ones of said first memory positions replacing values of said first data sequence, and providing said first data sequence to the display means;
  said computing means writing to a separate set of said first memory positions during each of a plurality of successive cycles of reading, computing, writing and providing.

12. The apparatus in accordance with claim 11, wherein an overall duration of each cycle of reading, computing, writing, and providing lasts a predetermined period of time.

13. The apparatus in accordance with claim 11, wherein third data values are written to a contiguous subset of said first memory positions in a non-sequential order during said successive cycles.

14. The apparatus in accordance with claim 11 further comprising analog to digital conversion means for sampling an input waveform, converting the input waveform to said second digital waveform data sequence, and sequentially writing said second digital waveform data sequence to said second memory positions.

* * * * *